(12) United States Patent
Oikawa

(10) Patent No.: US 12,165,995 B2
(45) Date of Patent: Dec. 10, 2024

(54) DESIGNING METHOD AND SEMICONDUCTOR DEVICE

(71) Applicant: RENESAS ELECTRONICS CORPORATION, Tokyo (JP)

(72) Inventor: Ryuichi Oikawa, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 406 days.

(21) Appl. No.: 17/720,699

(22) Filed: Apr. 14, 2022

(65) Prior Publication Data
US 2023/0335513 A1 Oct. 19, 2023

(51) Int. Cl.
| | |
|---|---|
| *H01L 23/66* | (2006.01) |
| *G06F 30/3953* | (2020.01) |
| *H01P 3/00* | (2006.01) |
| *H01P 3/08* | (2006.01) |
| *H01P 11/00* | (2006.01) |
| *H03K 5/01* | (2006.01) |

(52) U.S. Cl.
CPC .......... *H01L 23/66* (2013.01); *G06F 30/3953* (2020.01); *H01P 3/00* (2013.01); *H01P 3/08* (2013.01); *H03K 5/01* (2013.01); *H01L 2223/6638* (2013.01); *H01P 11/001* (2013.01)

(58) Field of Classification Search
CPC . H01P 11/001; H01P 3/00; H01P 3/08; H01L 23/66
USPC ........ 333/202, 204, 205, 236, 238, 239, 245
See application file for complete search history.

(56) References Cited

U.S. PATENT DOCUMENTS 10,090,881 B2    10/2018    Oikawa

FOREIGN PATENT DOCUMENTS

JP    2017-098926 A    6/2017

*Primary Examiner* — Rakesh B Patel
(74) *Attorney, Agent, or Firm* — Rimon P.C.

(57) ABSTRACT

The designing method according to an embodiment of the present invention is a method of designing a transmission line portion coupled between a transmission unit and a receiving unit, and transmitting a signal from the transmission unit to the receiving unit. Also, one-data-width distance is obtained by converting one-data-width interval, which is corresponding to a sampling period of an equalizer provided in one of the transmission unit and the receiving unit, to a distance. Further, a first reflection source for reflecting the signal is arranged at a position of the transmission line portion, where is corresponding to a ½-data-width distance corresponding to a half of the one-data-width distance. Here, the position corresponds to a grid point where a row grid line drawn on a screen used in the designing method and a column grid line drawn on the screen intersect with each other.

13 Claims, 15 Drawing Sheets

DESIGNING METHOD AND SEMICONDUCTOR DEVICE

BACKGROUND

The present invention relates to a designing method, and a semiconductor device designed by the designing method, a designing method according to a transmission line portion for transmitting a signal particularly at a highspeed (high-speed transmission line portion), and a semiconductor device comprising the transmission line portion.

When transmitting a signal on a transmission line, reflection such as multiple reflections is generated by discontinuous points of impedance in the transmission line, and thus the waveform of the signal is deformed by reflection and degradation may occur. To reduce the reflected signal generated by the reflection, DFE (decision feedback equalizer), a digital filter circuit such as FFE (feed forward equalizer), is used as an equalizer. For example, Japanese Unexamined Patent Application Publication No. 2017-98926 discloses a technique in which a wiring connected to a transmission line is used as an equalizer.

There are disclosed techniques listed below.
[Patent Document 1] Japanese Unexamined Patent Application Publication No. 2017-98926

SUMMARY

For example, the equalizer using DFE captures a signal at the sampling timing, performs arithmetic processing for calculating a predetermined coefficient to the captured signal, with respect to the signal arriving the calculation result, for example, subtracting. By choosing appropriate coefficients, the reflected signal can be reduced because the already captured signal, i.e., the value based on the previous signal in time, can be subtracted from the incoming signal.

However, in the transmission line, the reflected timing deviates from the sampling timing, so that the effect of reducing the reflected signal is reduced.

According to embodiments, there is provided a designing method, a semiconductor device, and an electronic device capable of suppressing a reduction in the effect of the equalizer.

Other problems and novel features will become apparent from the description herein and from the accompanying drawings.

The designing method according to an embodiment of the present invention is method of designing a transmission line portion coupled between a transmitting unit and a receiving unit and transmitting a signal from the transmitting unit to the receiving unit, the method including: (a) acquiring a one-data-width interval corresponding to a sampling period of an equalizer provided in one of the transmission unit and the receiving unit; (b) after the (a), obtaining one-data-width distance corresponding to the one-data-width interval by converting the one-data-width interval to a distance, and obtaining a ½-data-width distance corresponding to a half of the one-data-width distance; and (c) after the (b), arranging a first reflection source for reflecting the signal at a position in the transmission line portion, the position corresponding to the ½-data-width distance obtained in the (b), in which the position in the transmission line portion corresponds to a grid point where a row grid line drawn on a screen used in the designing method and a column grid line drawn on the screen intersect with each other.

In addition, the semiconductor device according to an embodiment includes: a transmitting unit for transmitting a signal; a receiving unit for receiving the signal; and a transmission line portion connected between the transmission unit and the receiving unit, an equalizer that equalizes a waveform of the signal is provided with one of the transmitting unit and the receiving unit, a reflection source for reflecting the signal is arranged at a position in the transmission line portion, the position corresponding to a ½-data-width distance, the ½-data-width distance corresponds to a half of one-data-width distance obtained by converting one-data-width interval corresponding to a sampling period of the equalizer to a distance, and the position in the transmission line portion corresponds to a grid point where a row grid line drawn on a screen used in designing the transmission line portion and a column grid line drawn on the screen intersect with each other.

BRIEF DESCRIPTIONS OF THE DRAWINGS

DETAILED DESCRIPTION

Figure 1:
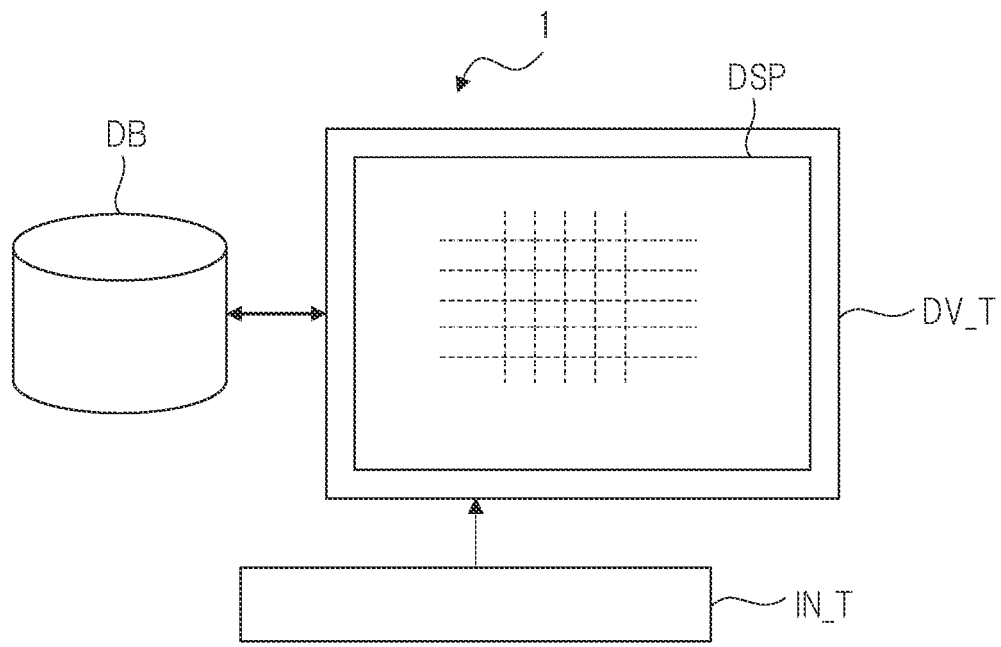
FIG. 1 is a block diagram showing a configuration of a development unit used in a designing method according to the first embodiment.

Hereinafter, embodiments of the present invention will be described in detail with reference to the drawings. In all the drawings for explaining the embodiments, the same portions are denoted by the same reference numerals in principle, and repetitive descriptions thereof are omitted.

Hereinafter, a plurality of embodiments will be described, and before that, a problem that the effect of the equalizer is lowered will be described with reference to the drawings in order to facilitate understanding of each embodiment.

<Reduce Equalizer Effect>

Figure 17A:
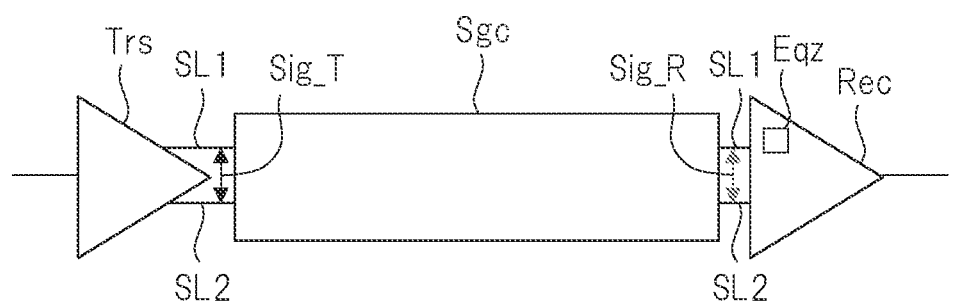
FIG. 17A is a diagram for explaining transmission of signals.
Figure 17B:
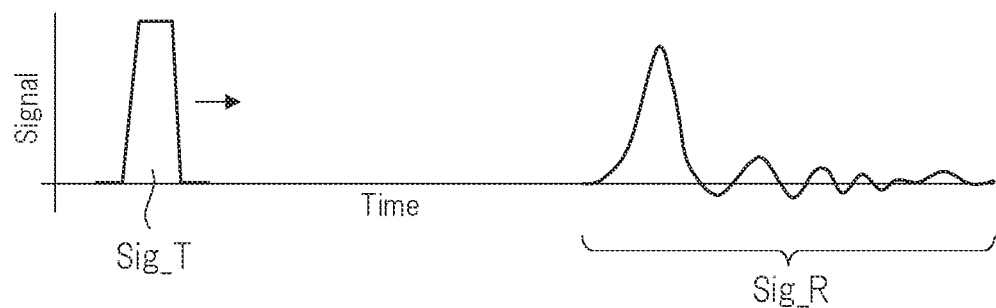
FIG. 17B is a diagram for explaining transmission of signals.

FIGS. 17A and 17B are diagrams for explaining transmission of signals. Here, FIG. 17A is a block diagram for explaining the transmission of the signal, FIG. 17B is a waveform diagram showing the waveform of the signal transmitted and received in the block shown in FIG. 17A.

In FIG. 17A, Trs denotes a transmitting unit that transmits a signal, and Rec denotes a receiving unit that receives a signal. From the transmission unit Trs, the signal Sig_T is output to the signal channel portion (transmission line portion) Sgc, the signal (transmission signal) Sig_T is propagated through the transmission line SL1, SL2 constituting the transmission line portion Sgc, the signal (received signal) Sig_R It is supplied to the receiving unit Rec as.

In FIG. 17B, the horizontal axis shows the time and the vertical axis shows the amplitude of the signal. In the figure, from the transmission unit Trs, a case where the signal (pulse signal) Sig_T which changes in a pulse shape is output is shown. When the signal Sig_T is output to the transmission line portion Sgc, the signal Sig_T is supplied to the reception unit Rec as the signal Sig_R after the delay time generated in the transmission line portion Sgc.

The transmission line SL1, SL2 constituting the transmission line portion Sgc, when the discontinuity of the impedance is present, at this impedance discontinuity, so that the signal propagating is reflected. Examples of impedance discontinuities, the portion where the line width of the transmission line SL1, SL2 varies, there is a bent portion or connecting portion or the like. These parts can be viewed as reflection sources that reflect the propagating signal. The reflected signal reflected by the reflection source is combined with the propagating signal to become the received signal Sig_R. In FIG. 17B, the received signal Sig_R deformed by multiple reflections is shown. That is, the received signal Sig_R is deformed to include a waveform that continuously attenuates to draw the tail resulting in a degraded signal.

<Configuration of Equalizer>

Figure 18A:
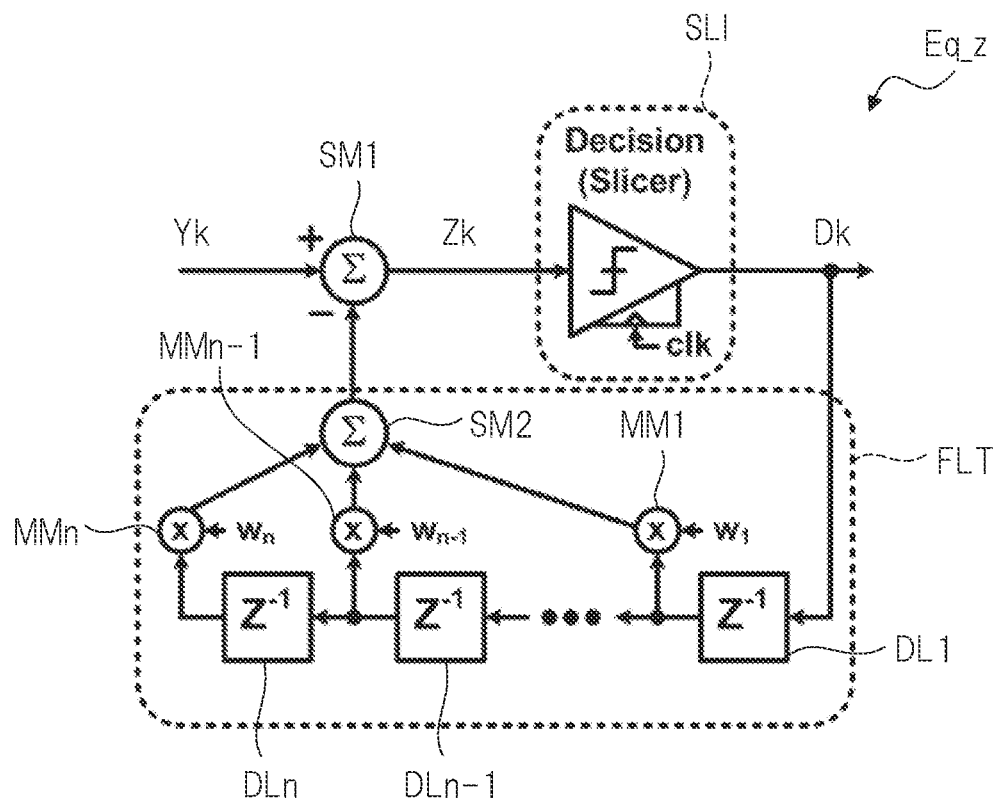
FIG. 18A is a diagram for explaining an equalizer.
Figure 18B:
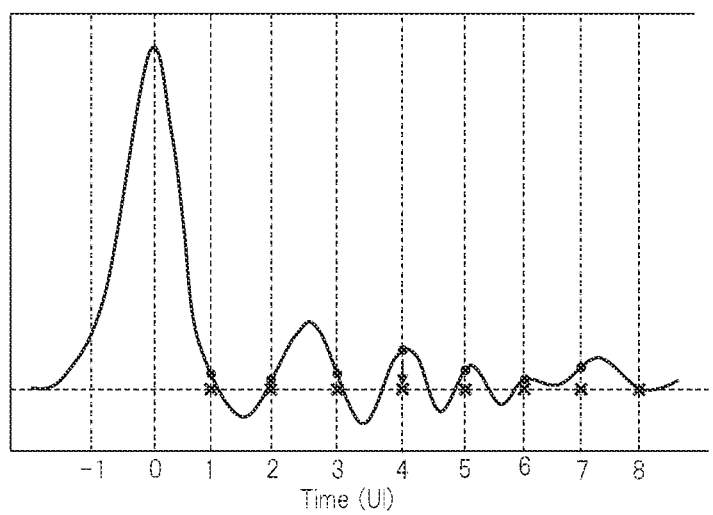
FIG. 18B is a diagram for explaining the equalizer.

FIGS. 18A and 18B are diagrams for explaining an equalizer. Here, FIG. 18A is a block diagram showing a configuration of an equalizer, FIG. 18B is a diagram for explaining that the effectiveness of the equalizer is reduced.

An equalizer is provided in at least one of the transmitting unit Trs and the receiving unit Rec. In FIG. 17A, an equalizer Eqz is provided in the receiver unit Rec. As the equalizer, as described above, DFE, although using a filter circuit such as FFE, here will be described the case of using the DFE.

Eqz equalizer of the DFE, as shown in FIG. 18A, an adder circuit SM1, and a feedback-type digital filter circuit FLT and a slicer SL1. In FIG. 18A, Yk shows a signal propagated through the transmission line (e.g. SL1 in FIG. 17A) and arrives at the equalizer Eqz in the receiving unit Rec (equalizer input signal), Dk shows the signal (equalizer output signal) output after equalization from the equalizer Eqz. The equalizer output signal Dk is processed by a circuit unit (not shown) at the receiving unit Rec.

Equalizer input signal Yk, by the summing circuit SM1, is operated with the signal (subtraction using the summing circuit) from the filter circuit FLT. Signal Zk obtained by this operation, by the slicer SLI, in synchronization with the clock signal clk, is sliced based on a predetermined value. That is, at the sampling timing determined by the clock signal clk, whether the value of the signal Zk exceeds the reference value is determined by the slicer SLI, the signal Zk, for example, is converted into a binary digital signal, is output as an equalizer output signal Dk.

The filter circuit FLT includes a delay circuit DL1 to DLn, a multiplier circuit MM1 corresponding to the delay circuit DL1 to DLn to MMn and an adder circuit SM2. Delay circuit DL1 to DLn are connected in series, equalizer output signal Dk is supplied to the delay circuit DL1 of the first stage. Each of the delay circuits DL1 to DLn delays the equalizer output signal Dk and the signal from the preceding stage and supplies it to the later stage delay circuit. The outputs of the respective delay circuits DL1 to DLn are supplied to the corresponding multiplier circuit MM1 to MMn. Each of the multiplication circuits MM1 to MMn performs a multiplication between the corresponding coefficients w1 to wn and the outputs from the corresponding delay circuits DL1 to DLn, and supplies the result of the multiplication to the addition circuit SM2. The summing circuit SM2 adds the outputs of the multiplying circuit MM1 to MMn, the result of the summing is supplied to the summing circuit SM1 as the output of the filtering circuit FTL.

Each of the delay circuits DL1 to DLn is represented by a Z-conversion notation in FIG. 18A, and as indicated by the Z-conversion code Z−1, the supplied signals are delayed by predetermined times and outputted. In this specification, each predetermined delay time of the delay circuit DL1 to DLn is referred to as a one-data-width interval (UI). In the digital filter circuit FLT, for each one-data-width interval, the signal supplied to the multiplier circuit MM1 to MMn and the summing circuit SM2 is changed, for each one-data-width interval, the signal supplied from the digital filter circuit FLT to the summing circuit SM1 is changed. Consequently, the summing circuit SM1, a value that varies for each one-data-width interval, so that the operation is performed between the equalizer input signal Yk.

The signal outputted from the transmitting unit Trs (FIG. 17A) to the transmission line SL1 varies in a cycle according to the transmission rate of this signal. The time of one-data-width interval is set to be proportional to the cycle of the transmission speed of the signal output from the transmission unit Trs. In the equalizer Eqz, the coefficient w1 to wn are multiplied by the equalizer output signal Dk output earlier in time (before the integer multiple of one-data-width interval), and the coefficient w1 to wn are subtracted from the equalizer input signal Yk. Thus, by setting an appropriate coefficient w1 to wn, the waveform of the signal output from the equalizer Eqz can be restored to an appropriate waveform.

In 18B, the horizontal axis indicates the time and the vertical axis indicates the voltage of the signal. Numbers shown on the horizontal axis of FIG. 18B represent one data-width interval. For example, with reference to the numerical value "0" on the horizontal axis, the numerical value "1" indicates after one-data-width interval, and the numerical value "2" indicates after twice one-data-width interval. The numerical value "−1" indicates one-data-width interval before the reference.

The waveform of the signal shown in FIG. 18B is similar to that of the received signal Sig_R shown in FIG. 17B. As described in FIG. 17B, due to reflections, the received signal Sig_R includes a waveform of the reflected signal that is continuously attenuated so as to be tailed. In FIG. 18B, the values of the reflected signals for each one-data-width interval are indicated by the • (black circle; mark. The equalizer Eqz calculates the value of the reflected signal for each one-data-width interval and subtracts it from the equalizer input signal. As a result, for each one-data-width interval, the value the reflected signal is changed from the value marked with • (black circle) to the value marked with X, so that the restoration of the signal is performed.

However, the timing at which the value of the reflected signal reaches the peak, if it deviates from one-data-width interval as shown in FIG. 18B, the value to be subtracted from the equalizer input signal is reduced, thereby reducing the effectiveness of restoring the waveform by the equalizer Eqz.

First Embodiment

<Overview>

In the first embodiment, a reflection source that reflects the signal is positioned so that the timing at which the value of the reflected signal reaches its peak and the one-data-width interval match. In the first embodiment, in the transmission line, for example, at a position corresponding to a half (½) of one-data-width interval, the reflection source is disposed. When a cycle of a signal to be transmitted matches a one-data-width interval (UI), the reflected signal reflected by the reflection source reaches its peak at a position corresponding to the one-data-width interval (one-data-width distance UD) by placing the reflection source at a position (½-data-width distance UD/2) corresponding to the ½-data-width interval (UI/2), it is therefore possible to increase the value of the reflected signal used in the operation in the equalizer. As a result, it is possible to suppress the effect of the equalizer from deteriorating.

Next, a designing method of placing a reflection source in the transmission line portion will be described with reference to the drawings.

<Overview of Development Device>

FIG. 1 is a block diagram showing a configuration of a development unit used in the designing method according to the first embodiment. In FIG. 1, 1 shows the development unit. The development device 1 includes a computer DV_T for development, an input device (e.g., a keyboard, a mouse, or the like) IN_T for the developer (not shown) to operate the computer DV_T, a monitor DSP integrated with the computer DV_T, and a storage device DB. Needless to say, the development unit 1 is not limited to the configuration shown in FIG. 1. For example, the monitor DSP may be separate from the computer DV_T, and the computer DV_T may also be used as a computer for other applications.

The storage device DB stores a design program and design data used in design. The computer DV_T executes the design program to realize the designing method according to the first embodiment. In the designing method, the developer operates the input device IN_T to design the transmission line portion while checking the transmission line portion displayed on the monitor DSP connected to the computer DV_T.

<Designing Method>

Figure 2:
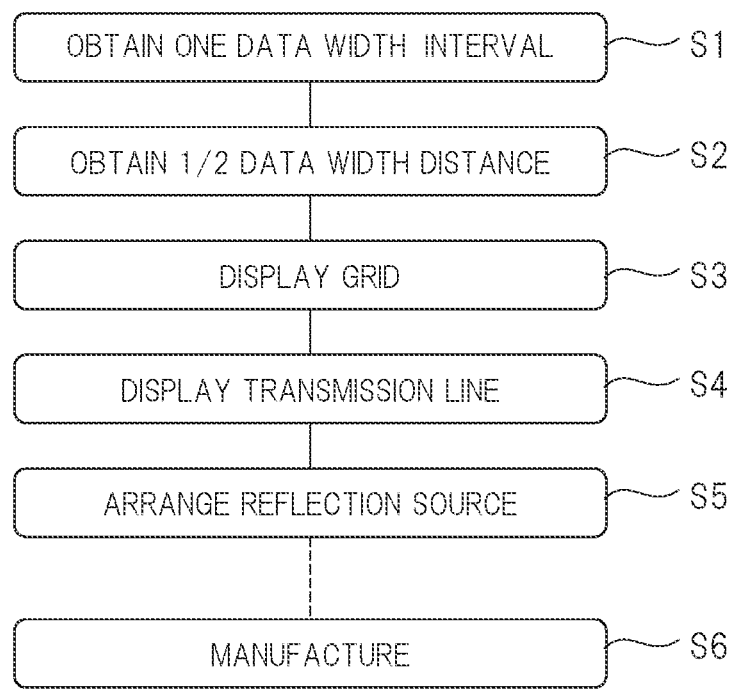
FIG. 2 is a flowchart showing a designing method of a transmission line portion according to the first embodiment.
Figure 3:
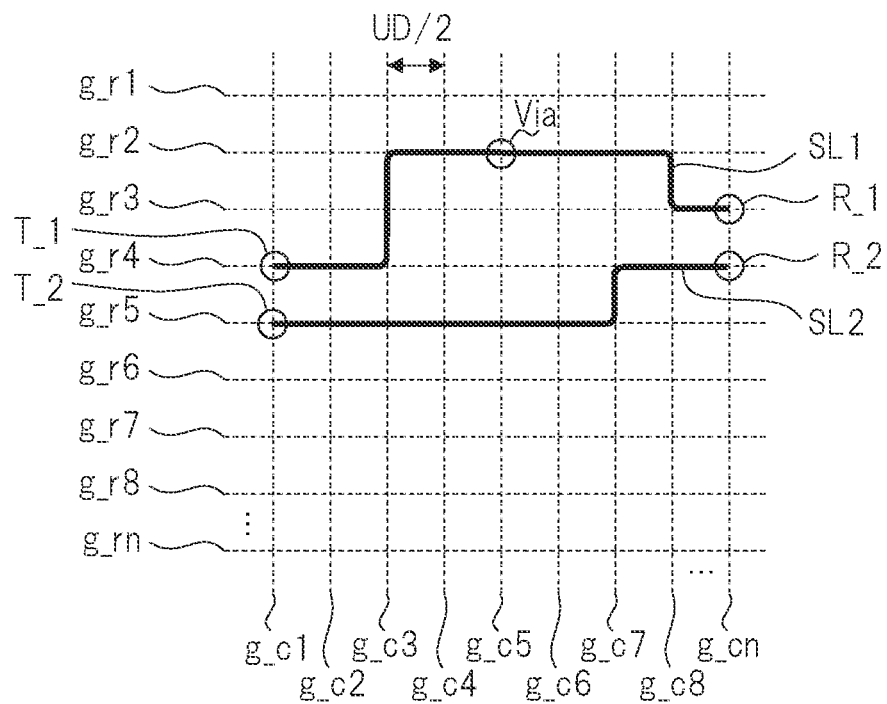
FIG. 3 is a diagram showing an example of a transmission line portion designed by the designing method according to the first embodiment.

FIG. 2 is a flowchart showing a designing method of the transmission line portion according to the first embodiment. Steps S1 to S5 shown in FIG. 2 are realized by the computer DV_T shown in FIG. 1 executing a design program. FIG. 3 is a diagram showing an example of a transmission line portion designed by the designing method according to the first embodiment.

FIG. 3 shows the transmission line portion displayed on the monitor DSP shown in FIG. 1. In FIG. 3, dashed lines g_r1 to g_rn and g_c1 to g_cn show grid lines drawn on the monitor DSP screen. Here, the grid lines g_r1 to g_rn are grid lines extending in the row direction and arranged in the column direction (hereinafter, also referred to as row grid lines), and the grid lines g_c1 to g_cn are grid lines extending in the column direction and arranged in the row direction (hereinafter, also referred to as column grid lines) so as to cross the row grid lines g_r1 to g_rn (orthogonal in the figure). That is, the grid lines g_r1 to g_rn and g_c1 to g_cn are arranged in a matrix (grid line matrix) of an orthogonal coordinate system. The distance between mutually neighboring grid lines, i.e. the delimiter between grid lines, is a half-data-width distance UD/2 (½-data-width distance UD/2) corresponding to a half-data-width interval (½-data-width interval) which is a half (½) of the one-data-width interval UI. For example, the distance between the grid line g_r2 and the grid line g_r3 (the distance of one partition) and the distance between the grid line g_r1 and the grid line g_r2 (the distance of one partition) are the ½-data-width distance UD/2 corresponding to the ½-data-width interval. Similarly, the distance between the grid line g_c2 and the grid line g_c3 and the distance between the grid line g_c1 and the grid line g_c2 are also ½-data-width distances UD/2.

In FIG. 3, T_1 and T_2 show signal terminals for signal transmission of the transmitting unit Trs (FIG. 17A). R_1 and R_2 denote signal terminals for signal reception of the reception unit Rec (17A in FIG. 3). A transmission line SL1 is connected between the signal terminals T_1 and R_1, and a transmission line SL2 is connected between the signal terminals T_2 and R_2. As shown in FIG. 17A, the transmission line portion Sgc includes transmission lines SL1 and SL2. Transmission line SL1, SL2, in FIG. 3 is disposed so as to overlap with the grid line, but is not limited thereto. For example, the transmission lines may be arranged between adjacent grid lines.

For ease of explanation, in FIG. 3, it is assumed that the signal terminals T_1, T_2 and R_1, R_2 are arranged so as to overlap with the intersection of the row grid line and the column grid line or the intersection (the intersection of g_cn and g_r4, g_r5 and the intersection of g_cn and g_r3, g_r4). Hereinafter, the intersection where the row grid line and the column grid line intersect with each other is also referred to as a grid point.

Since the signal terminals T_1 and T_2 are arranged at the grid points, a signal to be transmitted is supplied to the transmission line SL1, SL2 at the timing of the half-data-width interval. Similarly, the transmission line SL1, SL2 supplies signals to the reception unit Rec at the timings of the half-data-width interval.

As shown in FIG. 3, the signal terminal T_1 and the signal terminal R_1 are arranged in different row grid lines, and the signal terminal T_2 and the signal terminal R_3 are also arranged in different row grid lines. To connect between the signal terminals arranged in different row grid lines, in FIG. 3, the transmission line SL1, SL2 is bent as shown in the figure. When the transmission line is bent, impedance discontinuity occurs at the bent portion, which becomes a reflection source. Also in the signal terminals T_1, T_2, R_1, and R_2, impedance discontinuity occurs, and thus these are also reflection sources. In the first embodiment, the bent portion of the transmission line is disposed at an intersection (grid point) where the row grid lines and the column grid lines intersect. For example, the first bend of the transmission line SL1 is located at the intersection of the row grid line g_r4 and the column grid line g_c3.

In FIG. 3, Via indicates, for example, a terminal for connecting between the transmission lines formed in different layers from each other (via). Also in the terminal (first reflection source) Via, since the discontinuity of the impedance is generated, a reflection source. In the first embodiment, the terminal is as also arranged at a grid point which is an intersection of the column grid line (g_c5) and the row grid line (g_r2).

As shown in FIG. 3, the reflection source (signal terminal, the terminal. Via, the bent portion), the direction of transmitting a signal, i.e. intersecting with respect to the extending direction of the transmission line SL1, SL2 (in FIG. 3 perpendicular) grid lines and the transmission line overlap by placing at the intersection of the grid lines, the reflection source will be arranged every ½-data-width distance UD/2 corresponding to the ½-data-width interval. As a result, the peak of the reflected signal will occur at a position corresponding to one-data-width interval UI (one-data-width distance UD), it is possible to suppress reduction of the effect of the equalizer Eqz.

As described above, since the signal terminals T_1 and T_2 for supplying a signal to the transmission line SL1, SL2 are arranged at the intersection of the row grid line and the column grid line, each of the reflection sources is arranged at a position corresponding to an integral multiple of the ½-data-width distance UD/2 corresponding to the ½-data-width interval in the transmission line SL1, SL2 with reference to the intersection.

In FIG. 2, step S1 is a one-data-width interval acquiring step of acquiring a delay time of the delay circuits DL1 to DLn of the equalizers Eqz to be employed as a one-data-width interval UI. In the first embodiment, the equalizer Eqz is provided in the receiving unit Rec as shown in FIG. 17A. The delay circuitry DL1-DLns of equalizer Eqz are also shown in FIG. 18A. The delay times of the delay circuits DL1 to DLn are stored in advance in the storage device DB as design data, for example.

When the computer DV_T illustrated in FIG. 1 executes a program corresponding to step S1 in the design program, the computer DV_T reads the delay time of the delay circuits DL1 to DLn from the storage device DB and acquires the read delay time as a 1-data-width interval UI. The delay circuit, for example, the delay time of the delay circuit DL1, since the equalizer Eqz can be viewed as the sampling period for sampling the signal, step S1 can also be viewed as the step of acquiring the sampling period of the equalizer Eqz. Further, when the period and one-data-width interval UI of the signal to be transmitted is the same, step S1 can also be regarded as a step of obtaining the period of the signal to be transmitted.

When the period of the signal to be transmitted and the one-data-width interval UI are the same, the speed of the signal to be transmitted (transmission speed) may be stored in advance in the storage device DB as design data. In this case, in the program corresponding to step S1, the computer DV_T reads the transmission speed of the signal to be transmitted from the storage device DB and acquires one-data-width in based on the read transmission speed.

Step S2 is a ½-data-width distance acquiring process for converting the one-data-width interval UI acquired in step S1 into a distance, and further acquiring the ½-data-width distance UD/2 corresponding to the ½-data-width interval UI/2. That is, since the one-data-width interval UI is time-related data, the one-data-width interval UI is converted into the one-data-width distance UD and the ½-data-width distance UD/2, which are distance-related data, in step S2. As in step S1, the computer DV_T executes the program corresponding to step S2 in the design program, so that the computer DV_T acquires the ½-data-width distance UD/2.

More specifically, in step S2, the computer DV_T, in a program corresponding to step S2, regards the delay time of the delay circuits DL1 to DLn as one cycle of the signal, executes a well-known calculation method using the frequency (transmission speed) of the signal, the speed of light, and the relative permittivity of the board on which the transmission line for transmitting the signal is formed, and acquires one-data-width distance UD corresponding to one cycle of the signal. The relative permittivity and the speed of light of the substrate used for the calculation are also stored in advance in the storage device DB as design data, for example, and when the program corresponding to step S2 is executed, the relative permittivity, and the speed of light are read out from the storage device DB.

Next, the computer DV_T acquires the ½-data--width distance UD/2 corresponding to the ½-data-width interval UI/2 which is half of the delay time by setting the one-data-width distance UD to ½in the program corresponding to step S2. When the ½-data-width distance UD/2 is regarded as the distance (length) of one transmission line, the one-data-width distance UD can be regarded as the distance of the round trip of the transmission line.

Step S3 is a grid display step in which the computer DV_T displays the row grid lines g_r1 to g_rn and the column grid lines g_c1 to g_cn on the monitor DSP at intervals of the ½-data-width distance UD/2 based on the ½-data-width distance UD/2 acquired in step S2. The display of the grid lines is also performed by the computer DV_T executing a program corresponding to step S3.

Step S4 is a transmission line displaying step for displaying the transmission line SL1, SL2 on the monitor DSPs. For example, layout data related to the transmission line SL1, SL2 created by the developer is stored in the storage device DB in advance as design data. The computer DV_T reads the layout data from the storage device DB by executing a program corresponding to step S4, and displays the transmission line SL1, SL2 on the monitor DSP based on the read layout data. Although an example in which the layout data is stored in the storage device DB in advance has been described, the present invention is not limited to this. For example, in S4, the developer may input the layout data relating to the transmission line SL1, SL2 by operating the input device IN_T while checking the grid lines displayed on the monitor DSPs. In this case, the computer DV_T stores the input layout data in the storage device DB and also displays the transmission line SL1, SL2 on the monitor DSP.

Step S5 is a reflection source arranging step in which a developer arranges a reflection source, such as a bent portion, a terminal Via, and the like, on the transmission line SL1, SL2 by using the computer DV_T and the input device IN_T so that the reflection source is arranged at a position overlapping with a grid point, which is an intersection where the row grid line and the column grid line intersect (orthogonally) in the transmission line displayed on the monitor DSP. If the bent portion, the terminal, or the like is already provided in the transmission line, step S5 may be viewed as a reflection source arrangement adjustment step of the developer to adjust the position of the bent portion, the terminal, or the like so that the reflection source is disposed at the grid point. In this step S5, as described in FIG. 3, the reflection source (terminal Via, the bent portion, etc.), in the extending direction of the transmission line SL1, SL2, the row grid lines and the column grid lines are arranged so as to overlap the intersection intersecting. The computer DV_T stores the layout data including the reflection source obtained by executing step S5 in the storage device DB.

After step S5, through a plurality of unillustrated steps, in step S6, a semiconductor device or electronic device is manufactured comprising a transmission line portion in accordance with the layout data including the reflection source designed by steps S1-S5.

<Dummy Reflection Source>

In FIG. 3, all the reflection sources, in the transmission line has been described an example in which the row grid lines and the column grid lines are arranged at the intersection intersecting, the row grid lines and the column grid lines deviate from the intersection intersecting, there is a case where the reflection source is disposed. That is, there may be a reflection source inside the grid consisting of a ½-data-width-distance UD/2, rather than a grid point. In the first embodiment, in this case, a new reflection source is arranged as a dummy reflection source (dummy reflection source) at a grid point adjacent to the original reflection source that has already been arranged. By arranging a dummy reflection source, it is possible to suppress reduction of the effect of the equalizer Eqz, as described below.

Figure 4:
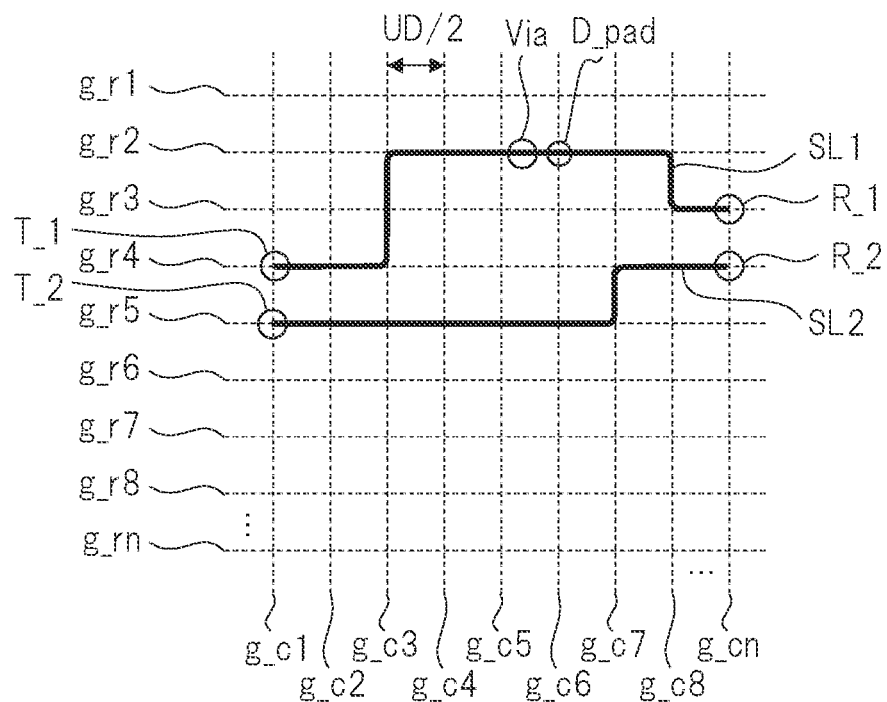
FIG. 4 is a diagram showing an example of a transmission line portion designed by the designing method according to the first embodiment.

FIG. 4 is a diagram showing an example of a transmission line portion designed by the designing method according to the first embodiment. FIG. 4 is similar to FIG. 3. The difference is that, in FIG. 4, the terminal (second reflection source) Via is arranged on the transmission line SL1 between two adjacent column grid lines g_c5 and g_c6. That is the terminal Via is disposed between the intersection of the row grid line g_r2 and the column grid line g_c5 and the intersection of the row grid line g_r2 and the column grid line g_c6, and is disposed within the ½-data-width distance UD/2 corresponding to the ½-data-width interval. The terminal Via, as described in FIG. 3, for example, a via for connecting between the transmission lines formed in different layers from each other (wiring layer).

Figure 5A:
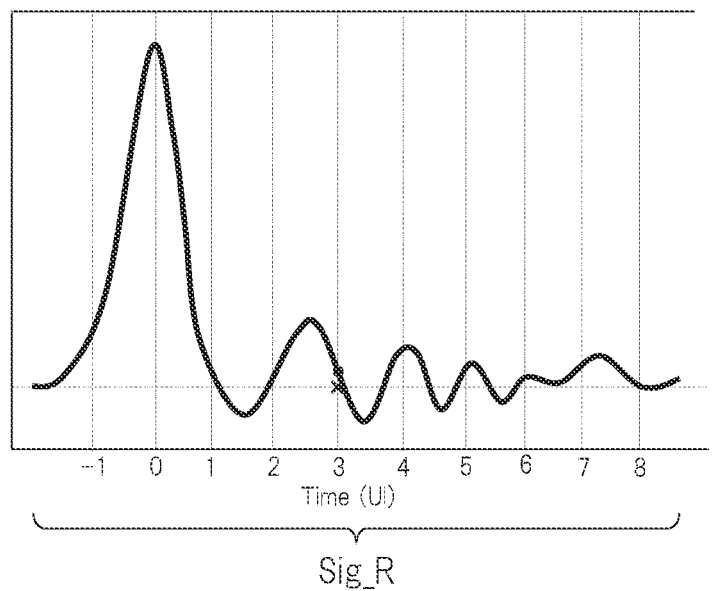
FIG. 5A is a waveform diagram for explaining effects of arranging a dummy reflection source accord n to the first embodiment.
Figure 5B:
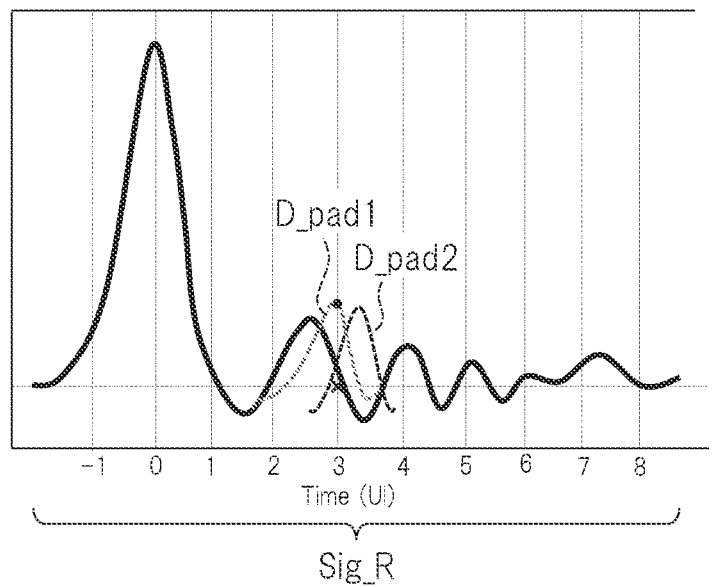
FIG. 5B is a waveform diagram for explaining effects of arranging the dummy reflection source according to the first embodiment.

FIGS. 5A and 5B are waveforms for explaining effects of arranging the dummy reflection source according to the first embodiment. FIG. 5A shows waveforms of the received signals Sig_R when the terminal Via is disposed between the column grid line g_c5 and the column grid line g_c6, that is, within the ½-data-width distance UD/2, as shown in FIG. 4. Since the reflection source terminal Via is disposed between the grid lines rather than the grid points, in the FIG. 5A, the value of the reflected signal reaches the peak in the second and third intervals, so that the effect of the equalizer Eqz is reduced.

FIG. 5B shows waveforms of the received signals Sig_R when the dummy reflection source D_pad is disposed at the intersection of the row grid line g_r2 and the column grid line g_c6 in the transmission line SL1 as shown in FIG. 4. Dummy reflection source D_pad, with reference to the terminal Via which is the original reflection source, a transmitting unit Trs side or the receiving unit Rec side, arranged in a grid point within ½-data-width distance UD/2 corresponding to the ½-data-width interval when measured with reference to the terminal Via.

Here, examples of arranging the dummy reflection sources D_pad at grid points displayed at intervals of ½-data-width distances UD/2 will be described. That is, the dummy reflection source D_pad is disposed at the intersection of the row grid line g_r4 and any one of the two column grid lines g_c5 and g_c6 defining the half-data-width distance UD/2 where the terminal Via serving as the reflection source is disposed.

As shown in FIG. 4, when the dummy reflection source D_pad arranged at the position of the transmission line SL1 corresponding to (overlapping with) the intersection of the column grid line (g_c5 in FIG. 4) arranged closer to the transmission unit Trs than the terminal Via and the row grid line g_r4, the reflection signal by the dummy reflection source D_pad and the reflection signal by the terminal Via are synthesized, and the peaks of the reflection signal occur at the position of the one data-width interval 3 as shown by the broken line D_pad1 in FIG. 5B. At the timing at which the arithmetic processing is performed in the equalizer Eqz, since the reflected signal reaches the peak, it is possible to suppress reduction of the effect of the equalizer Eqz.

On the other hand, when the dummy reflection source D_pad is arranged at the position of the transmission line SL1 corresponding to (overlapping with) the intersection of the column grid line (g_c6 in FIG. 4) arranged closer to the receiving unit. Rec than the terminal Via and the row grid line g_r4, the dummy reflection source D_pad generates a reflection signal as shown by a broken line D_pad2 in FIG. 5B, The reflected signal, shown by dashed line D_pad2, acts to cancel the reflected signal generated by the terminal Via, thereby allowing the reflected signal supplied to the equalizer Eqz to be reduced. That is, in this case, rather than suppressing the reduction of the effect of the equalizer Eqz, the effect of reducing the reflected signal is generated.

Thus, the dummy reflection source D_pad, with respect to the original reflection source (terminal Via), by placing the transmission unit side, the peak of the reflected signal generated by the original reflection source and the dummy reflection source can be a position integer multiple of one-data-width interval. Further, the dummy reflection source D_pad, with respect to the original reflection source (Via), by placing the receiving unit side, it is possible to attenuate the reflected signal generated by the original reflection source. In either case, the signal waveform can be improved by equalizing the transmitted signal waveform with equalizer Eqz.

In FIG. 3 and FIG. 4, a grid line matrix of a common orthogonal coordinate system composed of grid lines g_r1 to g_rn and g_c1 to g_cn arranged at equal intervals (UD/2) is used and designed, but the present invention is not limited thereto. For example, when the distance between the terminals T_1 and T_2 and the distance between the terminals R_1 and R_2 are not ½-data-width distance UD/2, grid line matrices of Cartesian coordinate systems differing from each other may be used for the transmission lines SL1 and SL2. When the distance between the terminals T_1 and T_2 (terminals R_1 and R_2) is, for example, 1.5 times the ½-data-width distance UD/2, the grid line matrix of the orthogonal coordinate system corresponding to the terminals T_1, R_1 and the transmission line SL1 may be the grid line matrix of the first orthogonal coordinate system, and the matrix obtained by translating the grid line matrix of the first orthogonal coordinate system by 1.5 may be the grid line matrix of the second orthogonal coordinate system corresponding to the terminals T_2, R_3 and the transmission line SL2. In this case, the transmission line SL1 is designed using the grid line matrix of the first orthogonal coordinate system, the transmission line SL2 will be designed using the grid line matrix of the second orthogonal coordinate system.

Thus, by using a grid line matrix corresponding to each of the transmission lines, the transmission line will extend so as to overlap the grid lines, the reflection source or/and the dummy reflection source may be arranged at the intersection of the row grid lines and the column grid lines.

Second Embodiment

In the second embodiment, semiconductor devices and electronic devices designed and manufactured in the designing method described in the first embodiment will be described.

Here, as a semiconductor device, a plurality of semiconductor chips (silicon die) are coupled by a high-speed transmission line portion, a structure mounted on the same package, what is called Sip (Silicon-in-Package) or chiplet will be described. Further, as the electronic device, a plurality of semiconductor devices are coupled by a high-speed transmission line portion, illustrating a module mounted on the same small mounting substrate. High-speed transmission line portion used in the semiconductor device and the electronic device is designed by the designing method described in the first embodiment.

<Electronic Device>

Figure 6A:
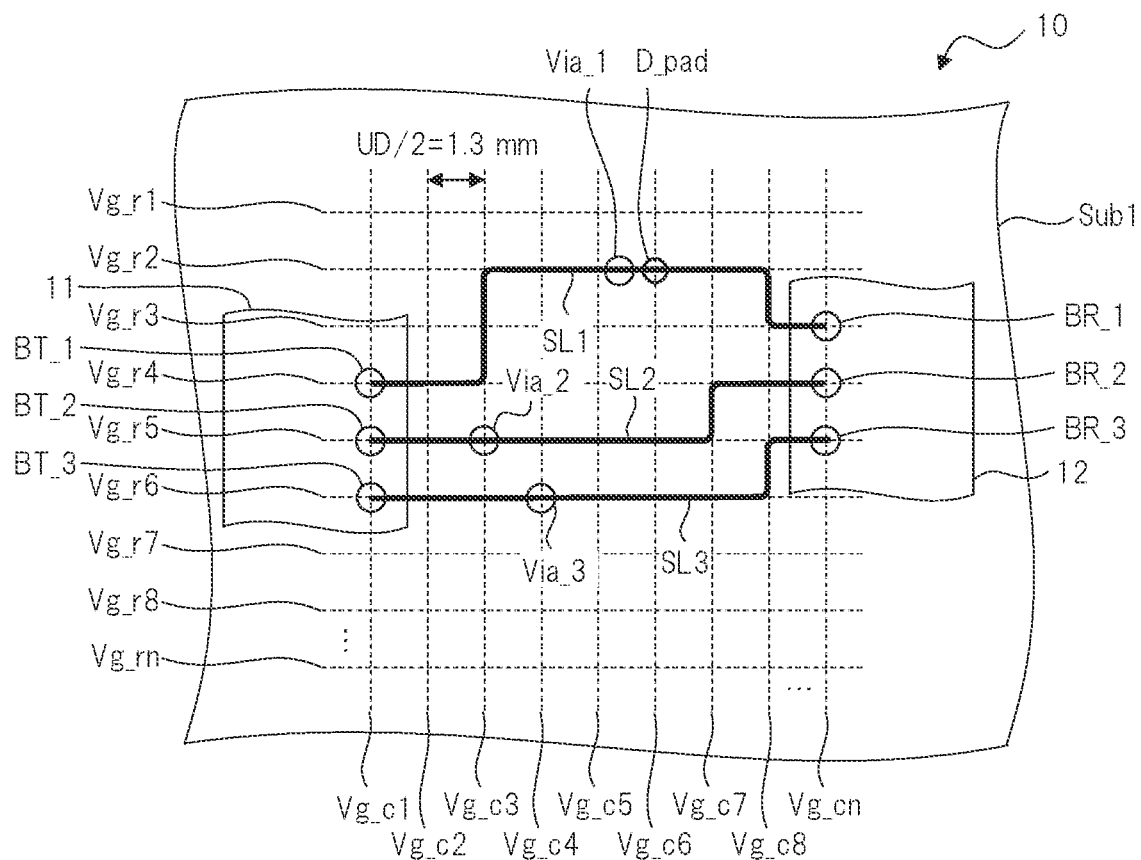
FIG. 6A is a diagram showing a configuration of an electronic device according to the second embodiment.
Figure 6B:
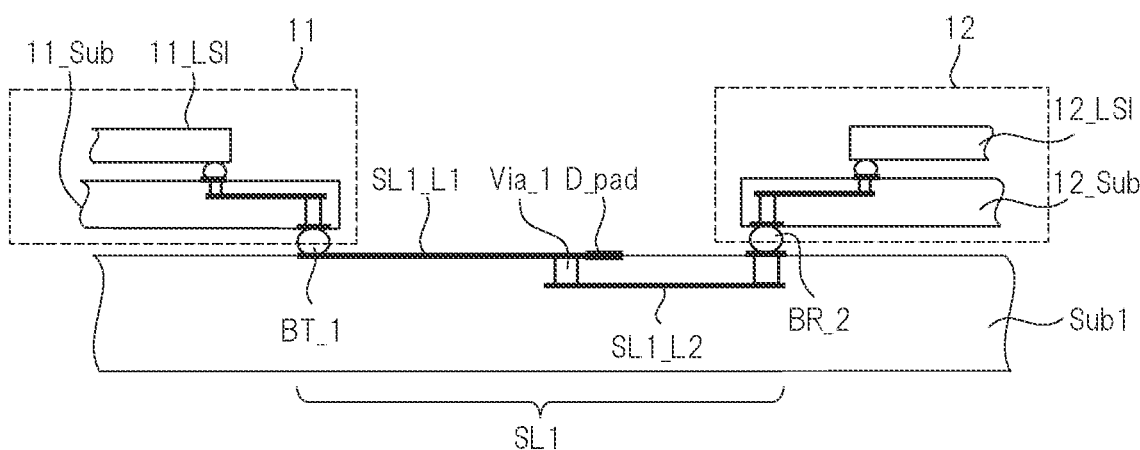
FIG. 6B is a diagram snowing a configuration of the electronic device according to the second embodiment.

First, an electronic device according to the second embodiment will be described with reference to the drawings FIGS. 6A and 6B are diagrams showing a configuration of an electronic device according to the second embodiment. Here, FIG. 6A is a plan view showing a plane of the electronic device, FIG. 6B is a cross-sectional view showing a cross-section of the electronic device.

Figure 10:
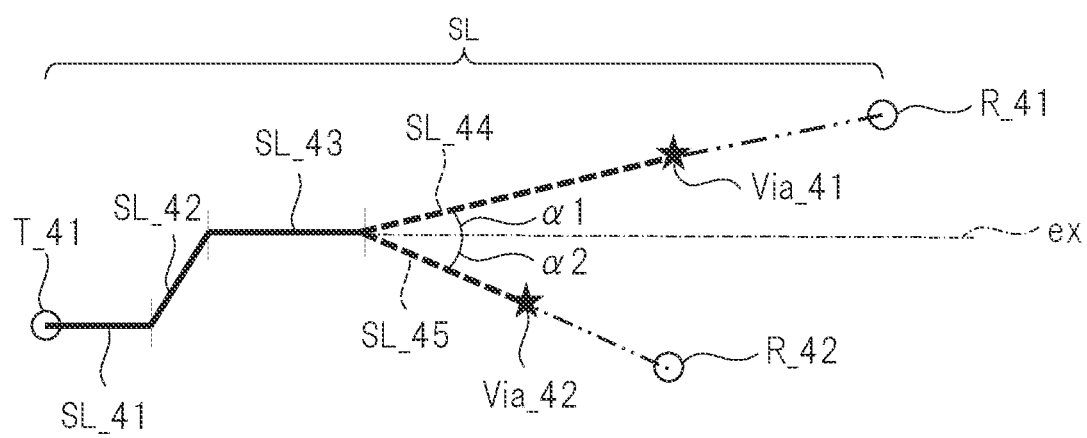
FIG. 10 is a plan view for explaining a transmission line portion according to the fourth embodiment.

In FIG. 6A, 10 denotes an electronic device according to the second embodiment. The electronic device 10 is provided with various circuit blocks or the like, but only the parts required for explanation are shown in FIG. 6A. Electronic device 10 is a module comprising a module board. Sub1, and a semiconductor device 11 and 12 mounted by solder balls thereon.

The first semiconductor device 11 includes a substrate 11_Sub and a semiconductor chip 11_LSI mounted on the substrate 11_Sub. Further, the semiconductor device (second semiconductor device) 12 also includes a semiconductor chip 12_LSI that has been implemented on the board 12_Sub and the board 12_Sub. Although not particularly limited, here, the semiconductor chip 11_LSI is provided with a transmission unit Trs, the semiconductor chip 12_LSI is provided with a receiving unit Rec, the receiving unit Rec is described as having an equalizer (not shown).

In FIG. 6A, broken lines Vg_r1 to Vg_rn and Vg_c1 to Vg_cn are virtual grid lines provided for explanation. As described in the first embodiment, the grid lines are displayed on the monitor DSP (FIG. 1) and are not displayed on the modular board Sub1, but in order to facilitate comprehension, the grid lines corresponding to the row grid lines g_r1 to g_rn and the column grid lines g_c1 to g_cn displayed on the monitor DSP at the stage of designing are clearly shown in FIG. 6A as virtual grid lines Vg_r1 to Vg_rn and Vg_c1 to Vg_cn. Also in the embodiments described below, for ease of understanding, grid lines not provided on the semiconductor device and the electronic device are illustrated as virtual grid lines. In the following description, the virtual grid lines Vg_r1 to Vg_rn are referred to as virtual row grid lines, and the virtual grid lines Vg_c1 to Vg_cn are also referred to as virtual column grid lines.

Between the semiconductor device 11 and 12, although not particularly limited, it will be described as transmission of signals is performed in 56 Gbps NRZ (Non-Return-to-Zero)) system. That is, in one transmission line, a signal is transmitted at a transmission rate of about 56 Gbps. Further, the relative dielectric constant of the modular board Sub1 is 4.0. The transmission rate, based on the relative dielectric constant and the speed of light, one-data-width distance UD is calculated, further ½-data-width distance UD/2 is calculated. In the example shown in FIG. 6, ½-data-width distance UD/2 becomes 1.3 (mm). As a result, in the virtual grid lines Vg_r1 to Vg_rn and Vg_c1 to Vg_cn, the virtual grid lines adjacent to each other are set to 1.3 (mm).

Output terminal of the transmission unit semiconductor chip, 11_LSI is provided, via the wiring formed on the substrate 11_Sub, is connected to the external terminal of the semiconductor device 11. Further, the input terminal of the equalizer in the receiving unit semiconductor chip 12_LSI is provided, via the wiring formed on the substrate 12_Sub, is connected to the external terminal of the semiconductor device 12. As shown in FIG. 6, the external terminal of the semiconductor device 11 is connected to the transmission line SL1 to SL3 formed on the module substrate Sub1 by the solder balls BT_1 to BT_3, and the external terminal of the semiconductor device 12 is connected to the transmission line SL1 to SL3 formed on the module substrate Sub1 by the solder balls BR_1 to BR_3. That is, the transmission line unit including a transmission line SL1 to SL3 formed on the module board Sub1, and a transmitting unit and the receiving unit are connected.

Reflection source in the transmission line SL1 to SL3, in each of the transmission lines, are arranged at a position overlapping the intersection (grid point) where the virtual row grid lines and the virtual column grid lines intersect. That is, in FIG. 6A, since each of the transmission line SL1 to SL3 is arranged so as to overlap with the virtual grid line, the reflection source, the virtual row grid line and the virtual column grid line intersect (in FIG. 6A, perpendicular) It is arranged at a position overlapping the intersection. For example, when the transmission line SL1 to SL3 is bent, as shown in FIG. 6A, the bent portion is arranged at a position overlapping with an intersection virtual row grid line and the virtual column grid line intersect.

In FIG. 6A, each transmission line SL1 to SL3 includes a transmission line formed in different layers on the modular board Sub1, and terminals Via_1 to Via_3 connecting different transmission lines. For example, as shown in FIG. 6B, the transmission line SL1 includes a transmission line (first transmission line) SL1_L1 formed on the front surface side (first layer L1) of the module substrate Sub1, a transmission line (second transmission line) SL1_12 formed in the interior of the module substrate Sub1 (second layer L2), and a terminal Via_1 for connecting the transmission lines SL1_L1 and SL1_L2 through an opening opened in the module substrate Sub1. In this embodiment, the transmission lines SL1_L1 to SL1_L2, the substrate 11_Sub constituting the semiconductor device 11 and 12, similarly to the wiring formed in 12_Sub, a wiring formed on the module board Sub1 (wiring pattern). The terminal Via_1 is a wiring (wiring pattern) formed inside a hole formed in an insulating layer (not shown) which constitutes the modular board SuB1 and is interposed between two wiring layers (here, the transmission line SL1_L1 and the transmission line SL1_L2) adjoining each other.

Since the terminals to Via_3 become discontinuous points of impedances and become reflection sources, the terminals Via_2 and Via_3 are arranged at positions overlapping the intersections of the virtual row grid lines and the virtual column grid lines as shown in FIG. 6A. On the other hand, the terminal Via_1 is arranged between the virtual column grid lines g_c5 and g_c6 at a position overlapping the virtual row grid line Vg_r2, that is, at an inner side of ½-data-width distance UD/2=1.3 mm corresponding to a ½-data-width interval. Since the terminal Via_1 as the reflection source is deviated from the grid point of the virtual grid line, in FIG. 6A, the dummy reflection source D_pad is arranged at a position overlapping with the intersection (grid point) where the virtual column grid line g_c6 and the virtual row grid line Vg_r2 intersect in the transmission line SL1. Since the dummy reflection source D_pad may be disposed at a position overlapping with the grid point when viewed in plan view, the dummy reflection source D_pad is formed in the first layer as shown in FIG. 6B, and is configured by a terminal (e.g., a pad) connected to the transmission line SL1_L1. In FIG. 6B and subsequent drawings, in order to clearly show the terminals constituting the dummy reflection source D_pad, its thickness is drawn thicker than the transmission line is not limited thereto.

The terminal constituting the dummy reflection source D_pad may be formed in the second layer and connected to the transmission line SL1_L1. Of course, as described with reference to FIG. 4, the dummy reflection source D_pad may be arranged so as to overlap the intersection (grid point) between the virtual column grid line g_c5 and the virtual row Vg_r2 near the transmission unit side.

Reflection source and the dummy reflection source, in the transmission line, by placing at a position overlapping the grid point where the virtual row grid lines and the virtual column grid lines intersect, it is possible to suppress reduction of the effect of the equalizer.

<Semiconductor Device>

Figure 7A:
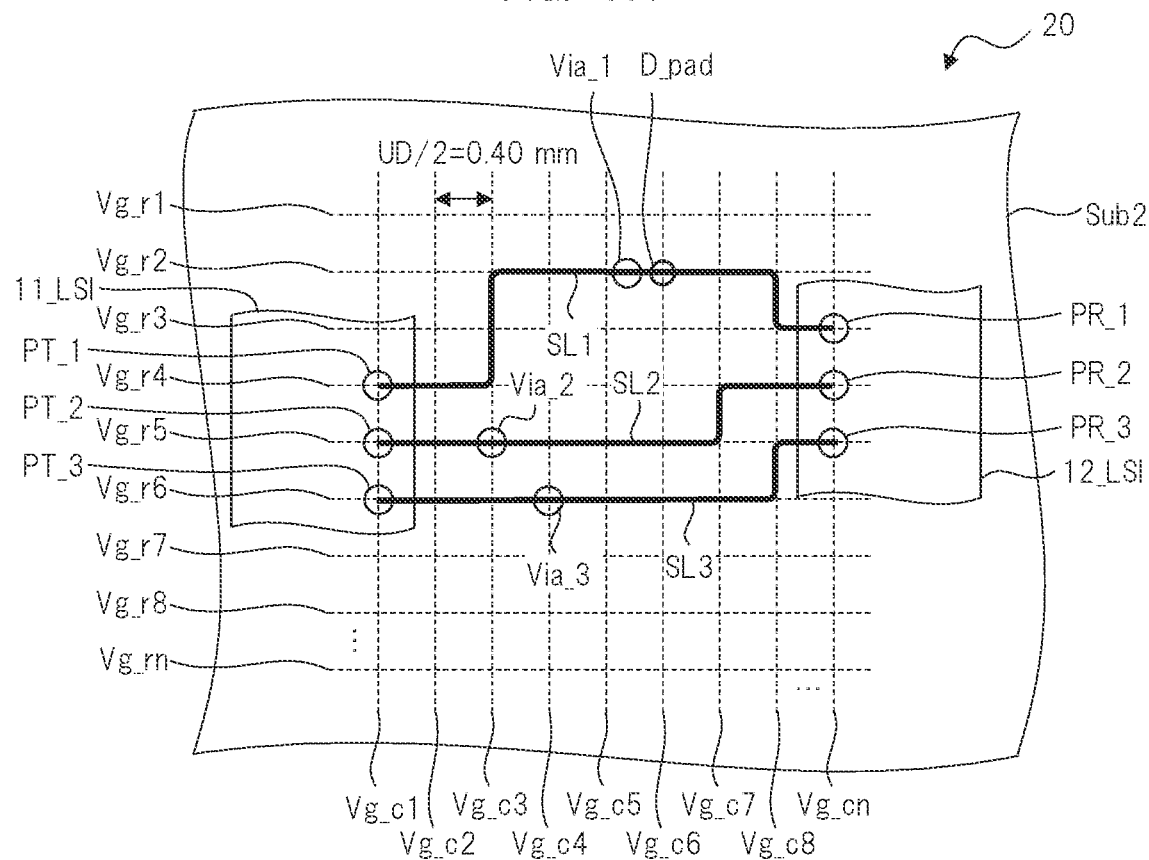
FIG. 7A is a diagram showing a configuration of a semiconductor device according to the second embodiment.
Figure 7B:
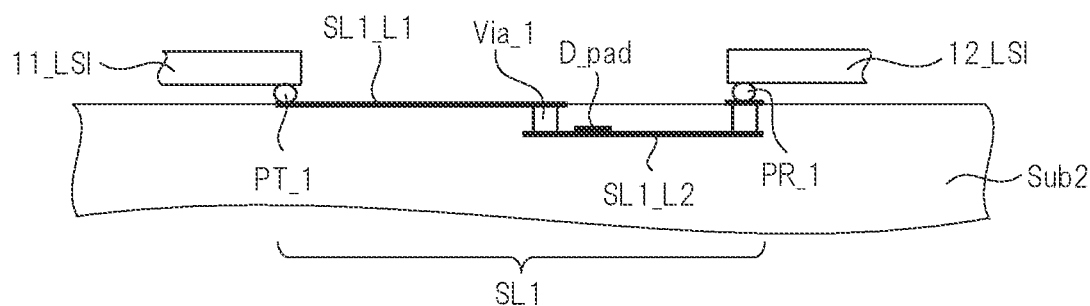
FIG. 7B is a diagram showing a configuration of the semiconductor device according to the second embodiment.

Next, a semiconductor device according to the second embodiment will be described with reference to the drawings. FIGS. 7A and 7B are diagrams showing a configuration of a semiconductor device according to the second embodiment. Here, FIG. 7A is a plan view showing a plane of the semiconductor device, FIG. 7B is a cross-sectional view showing a cross-section of the semiconductor device. Since FIGS. 7A and 7B are similar to FIGS. 6A and 6B, the main differences will be explained.

In FIG. 7A, 20 denotes a semiconductor device according to the second embodiment. Semiconductor device 20 is a Sip comprising a package substrate Sub2, and a semiconductor chip 11_LSI and 12_LSI flip-chip mounted thereon.

As shown in FIG. 7A, a grid line matrix of a rectangular coordinate system composed of virtual grid lines Vg_r1 to Vg_rn and Vg_c1 to Vg_cn is arranged on the package board Sub2.

Between the semiconductor chip 11_LSI and 12_LSI, but is not particularly limited, the transmission of signals in CNRZ (Chord NRZ system of 112 Gbps) will be described as being performed. That is, in each of the transmission line SL1 to SL3, the signaling is transmitted at a rate of about 112 Gbps. To accommodate this transmission rate, the sampling frequency of the equalizer is determined and one-data-width interval is defined. The ½-data-width distance UD/2 is obtained from the defined one-data-width interval. For Sip-structured semiconductor devices, as compared to the electronic device 10 shown in FIGS. 6A and 6B, it is possible to improve the transmission rate of the signal, and the half-data-width range UD/2 is 0.40 (mm).

Each transmission line SL1 to SL3 includes a transmission line (e.g., SL1_L1) formed in the first layer of the package substrate Sub2, a transmission line (SL2_L2) formed in the second layer, and a terminal (Via_1) for connecting the transmission line (SL1_L1) and the transmission line (SL1_L2) through an opening formed in the package substrate Sub2.

In FIG. 7A, PT_1 to PT_3 indicate pads to which the output terminals of the transmitting units in the semiconductor chip 11_LSI are connected, and PR_1 to PR_3 indicate pads to which the input terminals of the equalizer in the semiconductor chip 12_LSI are connected.

As shown in FIG. 7A, the terminals Via_2 and Via_3 are arranged at positions overlapping the intersections where the virtual row grid lines and the virtual column grid lines intersect in the transmission lines SL2 and SL3. Further, the bent portion of the transmission line SL1 to SL3, in each of the transmission lines, the virtual row grid lines and the virtual column grid lines are arranged at a position overlapping the intersection intersecting. Terminal Via_1 is between the virtual column grid lines Vg_c5 and Vg_c6, but is disposed at a position overlapping the virtual row grid lines Vg_r2, the dummy reflection source D_pad virtual column grid lines Vg_c6 and the virtual row grid lines Vg_r2 intersect It is arranged at a position overlapping with the intersection (grid point). In the transmission line, at a position overlapping with the intersection where the virtual row grid line and the virtual column grid line intersects, by placing the terminal and the bent portion serving as a reflection source, it is possible to suppress a reduction of the effect of the equalizer. Further, as in the terminal Via_1, even if the reflection source is disposed off the grid point, the dummy reflection source D_pad, adjacent to the reflection source (terminal Via_1) (nearest) grid point (intersection of the virtual row grid line and the virtual column grid line) by arranging at a position overlapping, it is possible to suppress reduction of the effect of the equalizer. As a result, in the receiving unit, it is possible to process the waveform of the good received signal.

In FIG. 6A and FIG. 7A, a grid line matrix of one common orthogonal coordinate system is used, but is not limited thereto. That is, as described in the first embodiment, for example, to prepare a grid line matrix of a plurality of orthogonal coordinate systems obtained by translating, it may be used grid line matrix of the orthogonal coordinate system corresponding to the transmission line.

Further, in the FIG. 7B, the terminals constituting the dummy reflection source D_pad, as in the case of the electronic device 10, since it is sufficient to be disposed at a position overlapping the grid point in a plan view, the dummy reflection source D_pad, rather than the second layer, it may be formed in the first layer.

Third Embodiment

In the second embodiment, an example of a semiconductor device and an electronic device for transmitting a single-ended signal in the transmission line portion. In the third embodiment, illustrating an example of a semiconductor device and an electronic device in the case of transmitting a differential signal in the transmission line portion.

For transmitting the differential signal, the transmission line portion comprises a pair of transmission lines for transmitting the differential signal (transmission line pair). In this case, the reflected signal generated by the reflection source in the transmission line pair is also a differential signal, the signal propagation time propagating through the transmission line pair will be measured at the center of each voltage of the differential signal. That is, the signal propagation time, when it is assumed that the transmission line is symmetrically arranged, will measure the voltage of the geometrical center of the transmission line pair In the third embodiment, the center between the reflection source (impedance discontinuity point) pairs of terminals Via or the like disposed in the transmission line pair is arranged at a position overlapping a intersection portion (grid point) where the virtual row grid line and the virtual column grid line intersect in the extending direction of the transmission line pair. That is, rather than a reflection source pair, a reflation source pair is disposed on the transmission line pair such that the center between the reflection source pair is disposed in a ½-data-width distance UD/2.

Further, if the center between the reflection source pair that is already disposed (original reflection source pair) is deviated from the ½-data-width distance UD/2, similarly to the second embodiment, the dummy reflection source is disposed. However, even in this case, each of the dummy reflection source pairs, rather than being arranged in the ½-data-width distance UD/2, the center between the dummy reflection source pairs, the intersection of the virtual row grid lines and the virtual column grid lines corresponding to the ½-data-width distance UD/2 (grid point) so as to be arranged at a position overlapping with, dummy reflection source pairs are arranged in the transmission line pair.

By the center between the reflection source pair or/and the center between the dummy reflection source pair is arranged at a position overlapping the grid point corresponding to the ½-data-width distance UD/2, it is possible to suppress reduction of the effect of the equalizer as in the second embodiment.

In the following description, the center between the reflection source pairs is referred to as a combined reflection source, and the center between the dummy reflection source pairs is referred to as a dummy combined reflection source.

<Electronic Device>

Figure 8A:
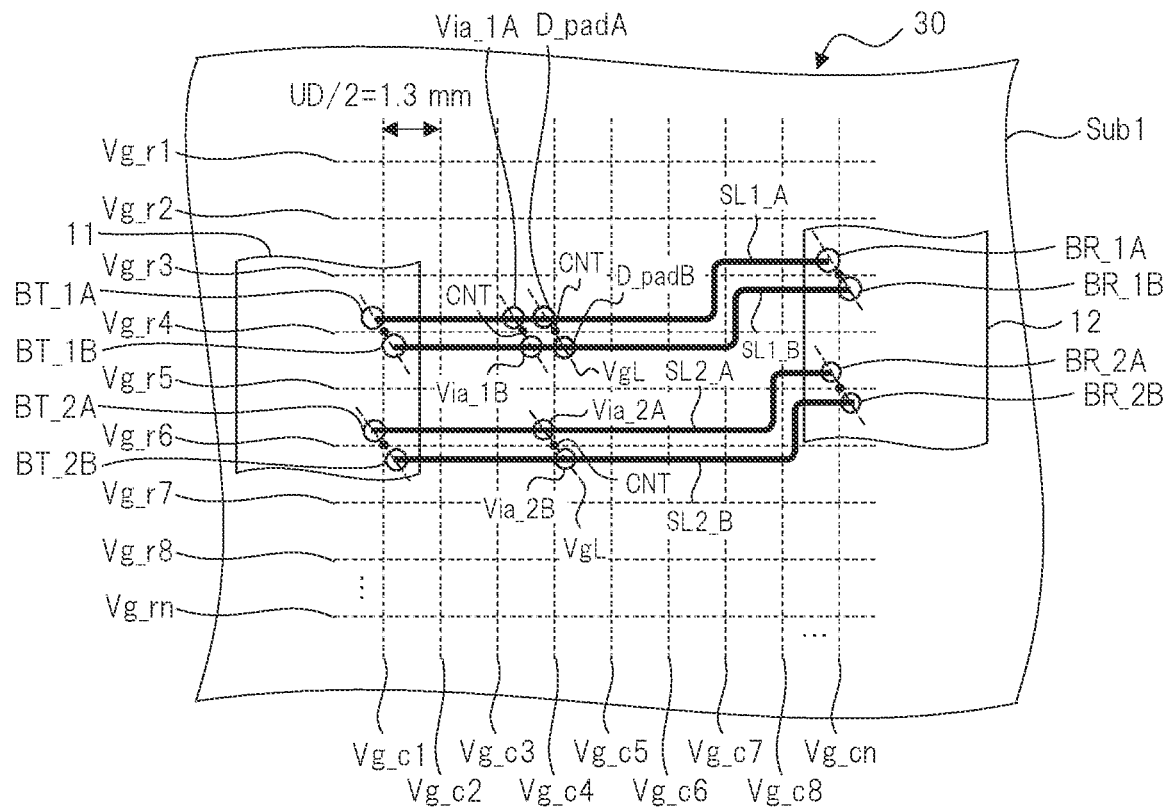
FIG. 8A is a diagram showing a configuration of an electronic device according to the third embodiment.
Figure 8B:
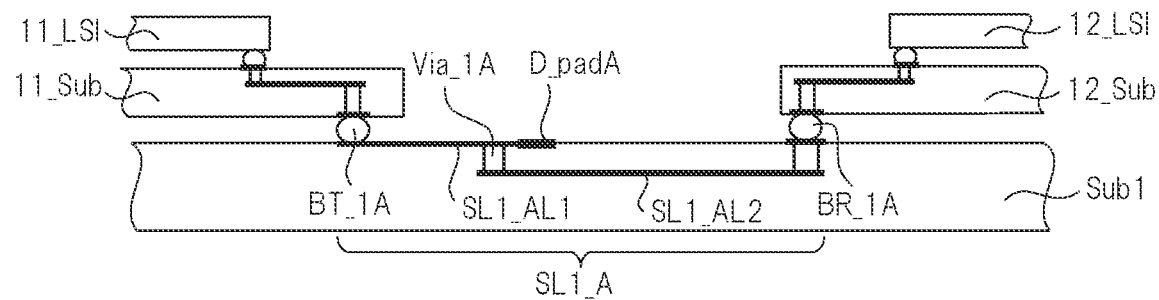
FIG. 8B is a diagram showing a configuration of the electronic device according to the third embodiment.
Figure 8C:
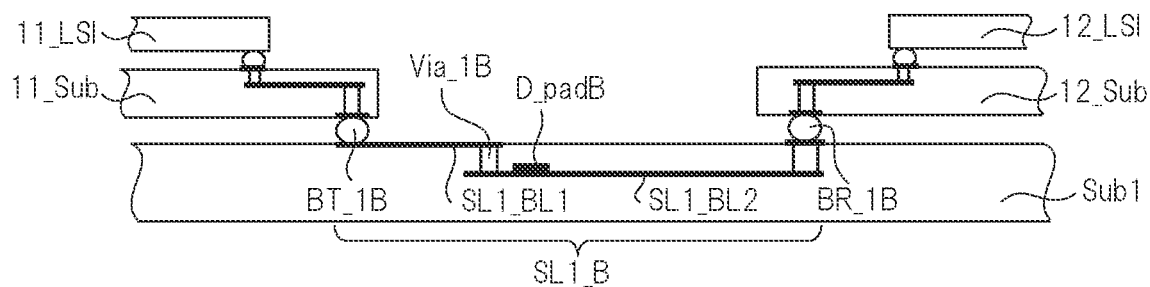
FIG. 8C is a diagram showing a configuration of the electronic device according to the third embodiment.

FIG. 8A to 8C are diagrams each showing a configuration of an electronic device according to the third embodiment. Here, FIG. 8A is a plan view showing a plane of the electronic device, FIG. 8B and 8C is a cross-sectional view showing a cross-section of the electronic device.

FIG. 8A is similar to FIG. 6A. The main difference is that, in FIG. 8A, instead of the transmission line SL1 to SL3, transmission line pars SL1_A, SL1_B and SL2_A, SL2_B for transmitting differential signals are formed on the modular board Sub1. Further, the virtual grid lines, when viewed in a plan view, as shown in FIG. 8A, sandwiched between the transmission line pair extending in the same direction as the extending direction, it is arranged so as to be parallel to the transmission line pair. At this time, the virtual grid line extends in the middle between the transmission line pairs sandwiching it. For example, when the virtual row grid line Vg_r4 is described, the virtual row grid line Vg_r4 is arranged to extend the middle between the transmission line pair SL1_A, SL1_B. The virtual column grid lines Vg_c1 to Vg_cn are arranged so as to intersect the virtual row grid lines Vg_r4. The ½-data-width distance UD/2, which is the distance between the virtual grid lines, is the same as the values shown in FIG. 6A.

In FIG. 8A, BT_1A, BT_1B and BT_2A, BT_2B, the transmission unit of the semiconductor device 11, shows a signal terminal (solder balls) pair for supplying a differential signal, BR_1A, BR_1B and BR_2A, BR_2B, the differential signal to the equalizer of the semiconductor device 12 It shows a signal terminal (solder balls) pair for supplying. Signal terminal pairs BT_1A, BT_1B and BT_2A, BT_2B, and signal terminal pairs BR_1A, BR_1B and BR_2A, and BR_2B are connected by transmission line pairs SL1_A, SL1_B and SL2_A, SL2_B, as shown in FIG. 8A.

FIG. 8B shows a cross-sectional view of the transmission line SL1_A, and FIG. 8C, shows a cross-sectional view of the transmission line SL1_B paired with the transmission line SL1_A. The transmission line SL1_A includes a transmission line SL1_AL1 formed in the first layer of the module substrate Sub1, a transmission line SL1_AL2 formed in the second layer, and a terminal Via_1A connecting between the transmission lines SL1_ AL1 and SL1_AL2 via the opening of the module substrate Sub1. Similarly, the transmission line SL1_B is composed of a transmission line SL1_BL1 formed in the first layer of the module substrate Sub1, a transmission line SL1_BL2 formed in the second layer, and a terminal Via_1B connecting between the transmission lines SL1_BL1 and SL1_BL2 via the opening of the module substrate Sub1. The terminals Via_1A and Via_1B constitute a reflection source pair. Transmission line pair SL2_A, SL2_B also has a similar configuration to the transmission line pair SL1_A, SL1_B, the terminal Via_2A and Via_2B constitute a reflection source pair.

The terminal BT_1A, the terminal BT_1B, the terminal BT_2A, and the terminal BT_2B also constitute a reflection source pair, and the terminal BR_1A the terminal BR_1B, the terminal BR_2A, and the terminal BR_2B also constitute a reflection source pair. Further, as described in the first embodiment, the bent portion of the transmission line pair also constitutes a reflection source pair.

In FIG. 8A, a broken line VgL connecting the centers of two terminals (e.g., Via_2A and Via_2B) constituting a pair of reflection sources is an imaginary line. The intersection (CNT) between the virtual line VgL and the virtual row grid line (Vg_r6) sandwiched between the transmission line pairs (SL2_A, SL2_B) is the center between the reflection source pairs and is a combined reflection source. As shown in FIG. 8A, for the terminals BT_1A and BT_1B, the terminals BT_2A and BT_2B, the terminals BR_2A and BR_1B, the terminals BR_2A and BR_2B, the terminals Via_2A and the terminal Via_2B, the respective terminals are arranged in a pair of transmission lines so that the combined reflection source CNT formed by the respective terminals overlaps the intersection portion where the virtual row grid line and the virtual column grid line intersect.

The composite reflection source CNT formed by the terminal Via_1A and the terminal Via_1B is not formed at the intersection of the virtual row grid line and the virtual column grid line as shown in FIG. 8A, but is formed between the virtual column grid lines Vg_c3 and Vg_c4 at the intersection of the virtual row grid line Vg_r4 and the virtual line VgL. Therefore, in FIG. 8, the dummy reflection source pairs D_patA and D_padB are arranged in the transmission line pairs SL1_A and SL1_B. The dummy combined reflection source CNT formed by the dummy reflection source pair D_patA and D_padB is arranged at the intersection of the virtual column grid line Vg_c4 and the virtual row grid line Vg_r4, as shown in FIG. 8A.

Dummy reflection source pair D_patA, D_padB is sufficient to be arranged in the transmission line pair in plan view so that the dummy conjoined reflection source formed thereby is arranged at the intersection of the virtual row grid line and the virtual column grid line. In FIG. 8B and 8C, the dummy reflection source D_padA is formed by a terminal formed in the first layer, the dummy reflection source D_padB is formed by a terminal formed in the second layer. However, the present invention is not limited thereto. For example, both the reflection sources D_padA and D_padB may be formed in the first layer or the second layer.

<Semiconductor Device>

Figure 9A:
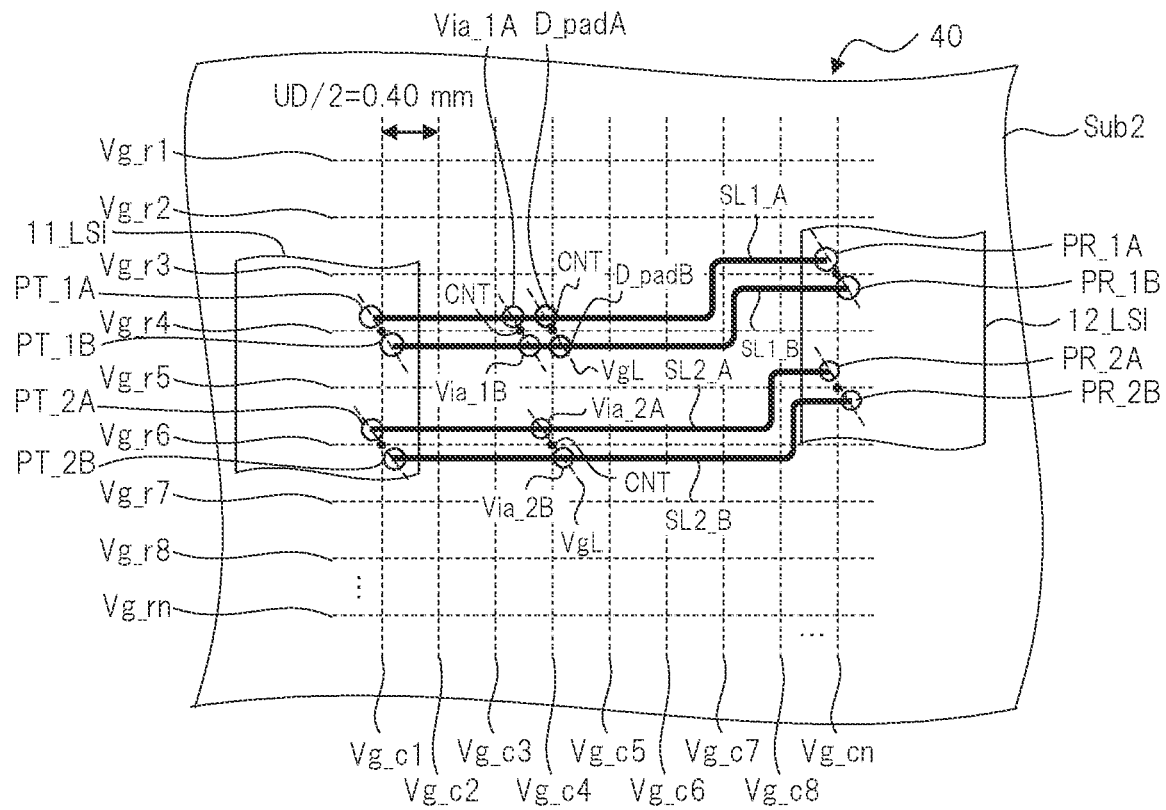
FIG. 9A is a diagram showing a configuration of a semiconductor device according to the third embodiment.
Figure 9B:
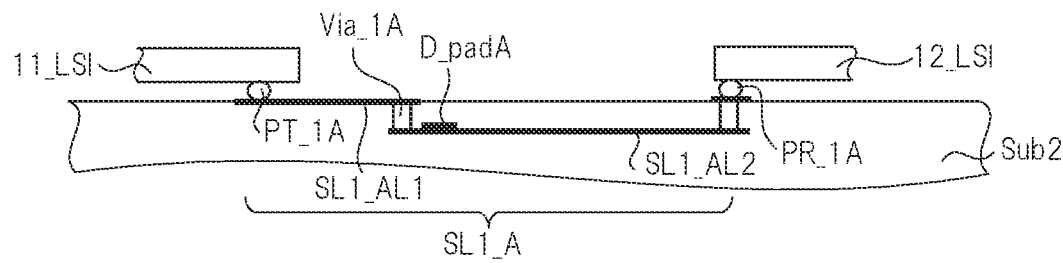
FIG. 9B is a diagram showing a configuration of the semiconductor device according to the third embodiment.
Figure 9C:
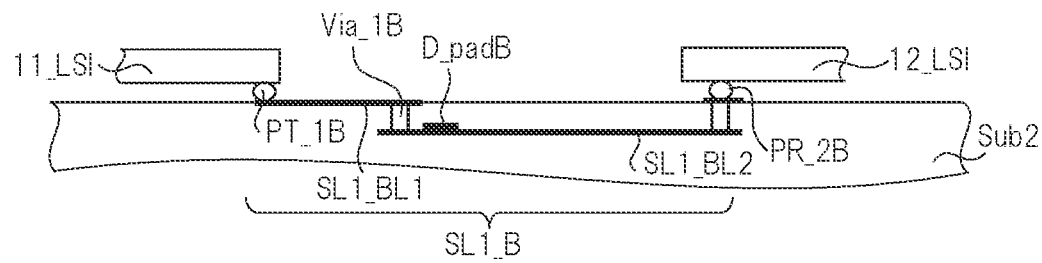
FIG. 9C is a diagram showing a configuration of the semiconductor device according to the third embodiment.

FIG. 9A to 9C are diagrams each showing a configuration of a semiconductor device according to the third embodiment. Here, FIG. 9A is a plan view showing a plane of the semiconductor device, FIGS. 9B and 9C are cross-sectional views showing a cross-section of the semiconductor device.

FIG. 9A s similar to FIGS. 7A and 8A. Main differences from FIG. 7A, similarly to FIG. 8A, so as to transmit the differential signal, the transmission line unit, the transmission line pair SL1_A, SL1_B and SL2_A, is constituted by SL2_B.

As shown in FIG. 9A, the pads PT_1A and PT_1B, the pads PT_2A and the pads PT_2B, the pads PR_1A and PR_1B, the pads PR_2A and PR_2B, and the combined reflection source CNT formed by the terminals Via_2A and Via_2B are arranged at the intersection of the virtual row grid lines and the virtual column grid lines, the pads PT_1A, PT_1B, PT_2A, PT_2B, PR1_A PR_1B, and PR_2A. PR_2B and terminals Via_2A and Via_2B are arranged in a transmission line pair.

The combined reflection source CNTs formed by the terminals Via_1A and Via_1B are formed on the virtual row grid line Vg_r4 and between the virtual column grid lines Vg_c5 and Vg_c4, rather than at the intersection where the virtual row grid line and the virtual column grid line intersect, as shown in FIG. 9A. Therefore, in FIG. 9A, the dummy reflection source pairs D_patA and D_padB are arranged in the transmission line pairs SL1_A and SL1_B. The dummy combined reflection source CNT formed by the dummy reflection source pair D_patA and D_padB is arranged at the intersection of the virtual column grid line Vg_c4 and the virtual row grid line Vg_r4, as shown in FIG. 9A.

Dummy reflection source pair D_patA, D_padB is sufficient to be arranged in the transmission line pair in plan view so that the dummy combined reflection source formed thereby is arranged at the intersection portion (grid point) of the virtual row grid line and the virtual column grid line intersect. In FIGS. 9B and 9C, both of the dummy reflection sources D_padA and D_padB are formed by the terminals formed in the second layer. As in FIG. 8A, as compared with forming the wiring as a transmission line pair to the module substrate, towards forming the wiring as a transmission line pair to the substrate with Sip, it is possible to form a fine wiring pattern. Therefore, when it is difficult to form a fine wiring pattern, as shown in FIG. 8B and 8C, to form a terminal serving as a dummy reflection source in different layers, when it is easy to form a fine pattern, as shown in FIGS. 9B and 9C, to form a terminal serving as a dummy reflection source in the same layer.

A terminal serving as a dummy reflection source pair, by forming in different layers, in the same layer, it is possible to prevent the terminal is concentrated, it is possible to reduce the size of the area when viewed in a plan view. On the other hand, by forming the terminal serving as the dummy reflection source pair in the same layer (for example, the second layer), it is possible to use the layer (the first layer) which is not used for forming the terminal for other purposes, and for example, the degree of freedom can be improved.

According to the third embodiment, even when performing transmission using a differential signal, it is possible to suppress reduction of the effect of the equalizer.

In FIG. 8A and FIG. 9A, the combined reflection source CNT disposed at the intersection where the virtual row grid lines and the virtual column grid lines intersect is regarded as the first combined reflection source, the virtual row and the virtual column grid lines combined reflection source CNT disposed at a position that is not the intersection (e.g., a combined reflection source CNT as formed by the terminal Via_1A and the terminal Via_1B) can be regarded as a second combined reflection source. In this case, the reflection sources forming the first combined reflection source, e.g. the reflection sources Via_2A, Via_2B, can be considered as second reflection sources and the reflection sources. D_padA, D_padB can be considered as dummy reflection sources.

Fourth Embodiment

In the first to third embodiments, an example is shown in which transmission lines are arranged along grid lines (virtual grid lines) arranged in orthogonal coordinates. That is, when bending the transmission line, the extending direction of the transmission line was changed to a right angle (90□). However, only the transmission line having changed the extending direction at a right angle, it may not always be easy to perform the layout of the appropriate transmission line. In the fourth embodiment, the transmission line, rather than at right angles, will be described a case of placing by bending at any angle.

FIG. 10 is a plan view for explaining a transmission line portion according to the fourth embodiment. In FIG. 10, SL shows a transmission line for transmitting a single-ended signal. The transmission line SL is connected to the terminal T_41, and a single-ended signal is supplied to the terminal T_41. The signal propagated through the transmission line SL is supplied to the terminal R_41 or R_42. Terminal R_41 or R_42 is connected to the input of the equalizer (not shown).

Transmission line SL is configured by a partial transmission line SL_41 to SL_44 (or SL_45). Here, the partial transmission line (fourth transmission line) SL_44 or SL_45 connected to the partial transmission line (third transmission line) SL_43 extends in the second direction at arbitrary angles α1 and α2 that are not orthogonal (90 degrees) to the extending direction (first direction) ex of the partial transmission line SL_43. That is, the transmission line SL is bent at arbitrary angles α1 and α2.

In this instance, the reflection source Via_41 is disposed at a position where the integrated wire length of the partial transmission lines SL_41, SL_42, SL_43, and SL_44 is an integral multiple of the half-data-width distance UD/2 with reference to the terminal T_41. The reflection source Via_42 is disposed at a position where the integrated wire length of the partial transmission lines SL_41, SL_42, SL_43, and SL_45 is an integral multiple of the half-data-width distance UD/2 with reference to the terminal T_41. Since the reflection source is arranged at a position of an integral multiple of the ½-data-width distance UD/2, it is possible to suppress reduction of the effect of the equalizer (not shown).

Also in the fourth embodiment, if the terminal or the like is disposed at a position not corresponding to an integral multiple of the ½-data-width distance UD/2, by placing the dummy reflection source, it is possible to suppress reduction of the effect of the equalizer.

When using a grid line, when designing the transmission line portion, rather that using a grid line arranged in orthogonal coordinates, for example, a grid line arranged so as to be parallel to each partial transmission line portion (parallel grid lines) is used. In this case, using the end of the parallel grid lines corresponding to the terminal T_41 as a reference (reference end), the reflection source position candidates are set to each of the positions (intersection) so that the integrated length of the parallel grid lines is an integral multiple of the ½-data-width distance UD/2. The developer can place a reflection source or dummy reflection source at a position of an integer multiple of the ½-data-width range UD/2 by placing the reflection source or dummy reflection source at a position of the transmission line corresponding to the reflection source position candidates of the parallel-grid line.

Transmission line SL shown in FIG. 10 may be a transmission line in the semiconductor device, it may be a transmission line in the electronic device.

<Differential Signal>

Figure 11A:
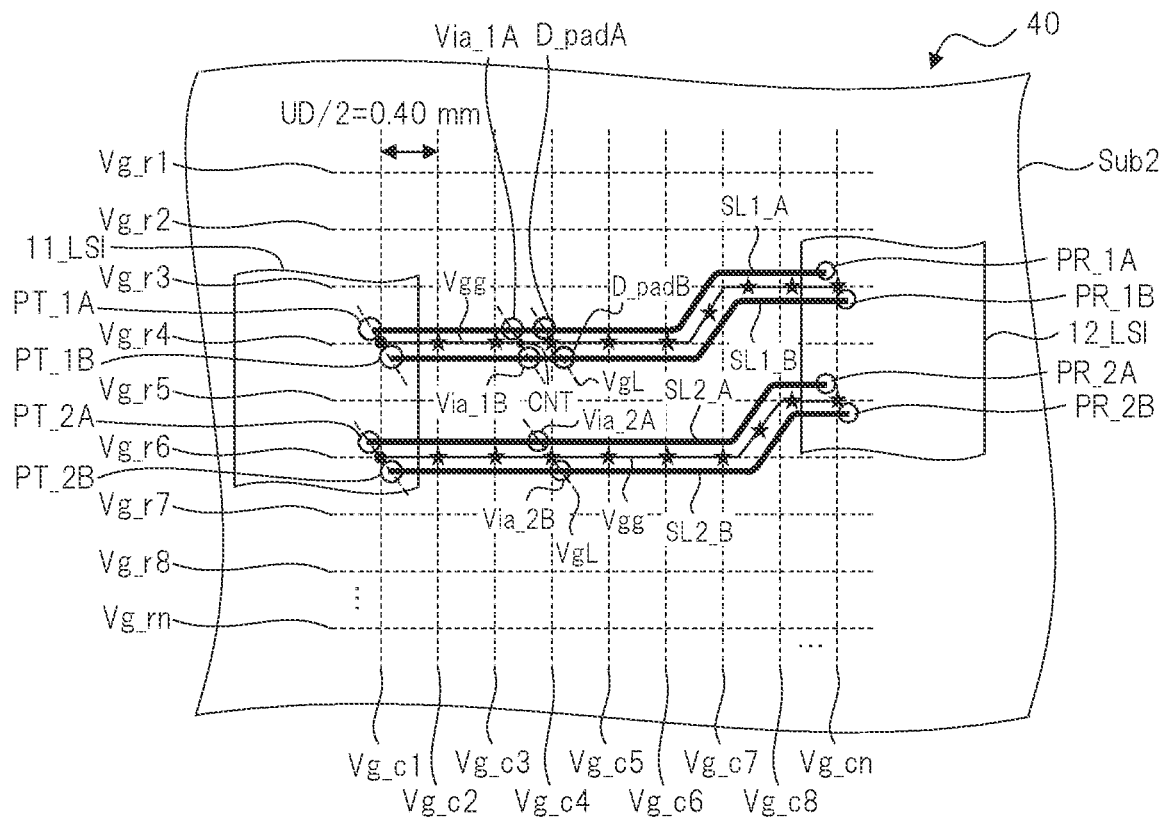
FIG. 11A is a diagram showing a configuration of a semiconductor device according to the fourth embodiment.
Figure 11B:
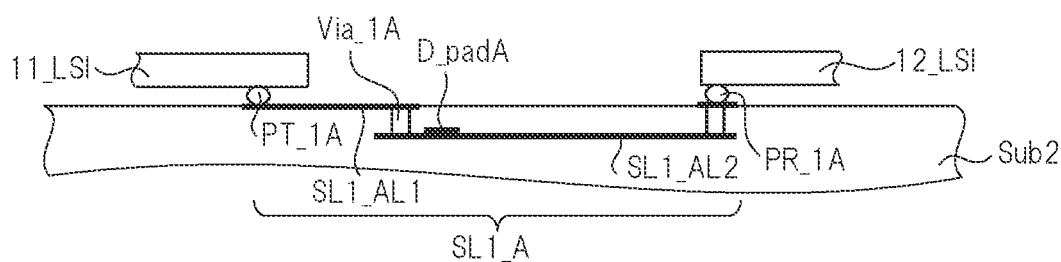
FIG. 11B is a diagram showing a configuration of the semiconductor device according to the fourth embodiment.
Figure 11C:
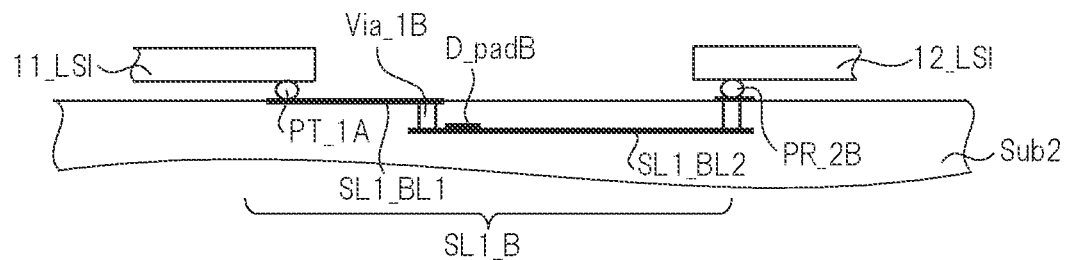
FIG. 11C is a diagram showing a configuration of the semiconductor device according to the fourth embodiment.

FIG. 11A to 11C are diagrams each showing a configuration of a semiconductor device according to the fourth embodiment. FIG. 11A is a plan view showing a plane of the semiconductor device, FIGS. 11B and 11C are cross-sectional views showing a cross-section of the semiconductor device.

FIGS. 11A to 11C are similar to FIGS. 9A to 9C. The main difference is that in FIG. 11A, the transmission line pair SL_1A, SL_1B and SL_2A, SL_2B is provided with a portion which is bending at an arbitrary angle rather than a right angle (a portion defined by the virtual column grid lines Vg_c6 to Vg_cn and the virtual row grid lines Vg_r2 to Vg_r7). In this bent portion, each transmission line of the transmission line pair includes a partial transmission line (e.g., SL_43) extending in a first direction and a partial transmission line (e.g., SL_44) extending in a second direction intersecting with the first direction, in the same manner as shown in FIG. 10. Further, in FIG. 11A, Vgg shows a virtual parallel-grid lines. Virtual parallel grid line Vgg, the transmission line pair (e.g., SL1_A, SL1_B) between the middle between, the transmission line pair SL1_A, parallel to SL1_B, the transmission line pair SL1_A, is arranged along the SL1_B.

In FIG. 11A, although a virtual grid lines also specified as a grid line of the orthogonal coordinate system, in the fourth embodiment, rather than a grid line of the orthogonal coordinate system, the transmission line portion is designed using the virtual parallel grid line Vgg.

In the virtual parallel grid line Vgg, candidates for the reflection source position (which can also be regarded as a combined reflection source position because it is a differential signal) are set for each position where the integration length of the virtual parallel grid line Vgg is an integral multiple of the ½-data-width distance UD/2 with reference to the position of the black circle mark • corresponding to the terminals PT_1A and PT_1B in FIG. 11A, candidates for reflection source positions are marked with stars. At the position of the reflection source position candidate, so that the combined reflection source or/and dummy combined reflection source is disposed, the reflection source and the dummy reflection source is disposed on the transmission line pair.

In FIGS. 11A to 11C, the semiconductor device has been described as an example, and of course, the same applies to the electronic device.

According to the fourth embodiment, the effect of the equalizer can be suppressed from reducing while the transmission line is bent at an arbitrary angle other than a right angle. In addition, since the transmission line can be bent at an arbitrary angle, it is possible to reduce the number of bends of the transmission line and to reduce the reflection source generated by the bend.

Fifth Embodiment

The reflection source and the dummy reflection source, which are impedance discontinuities, are formed by a pad, a bump, a via, or the like whose width is larger than the width of the transmission line, that is, the length in the direction perpendicular to the extending direction of the transmission line, when viewed in a plan view, as shown in FIG. 6A to FIG. 11C. In the fifth embodiment, various terminals forming a dummy reflection source are exemplified. Since the terminal forming the dummy reflection source can be used as a reflection source, the dummy reflection source exemplified in the fifth embodiment may be regarded as a reflection source.

FIG. 12A to 12D, FIG. 13A to 13D, and FIG. 14A to 14D are diagrams showing structures of dummy-reflection sources according to the fifth embodiment. These figures show the construction of the dummy reflection source shown in FIGS. 11A-11C. Of course, the structures shown in these figures may be used as the reflection sources and dummy reflection sources shown in FIGS. 6A to 10.

Figure 12A:
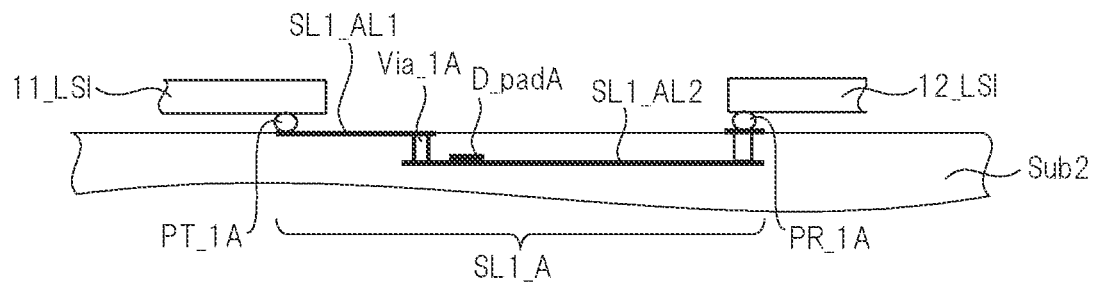
FIG. 12A is a diagram showing a configuration of a dummy-reflection source according to the fifth embodiment.
Figure 12B:
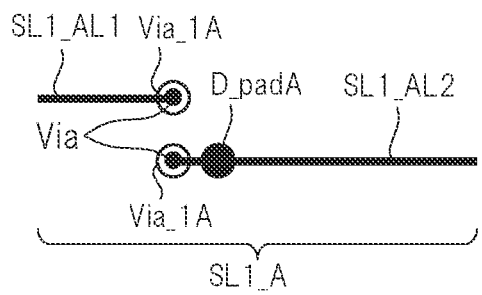
FIG. 12B is a diagram showing a configuration of the dummy-reflection source according to the fifth embodiment.
Figure 12C:
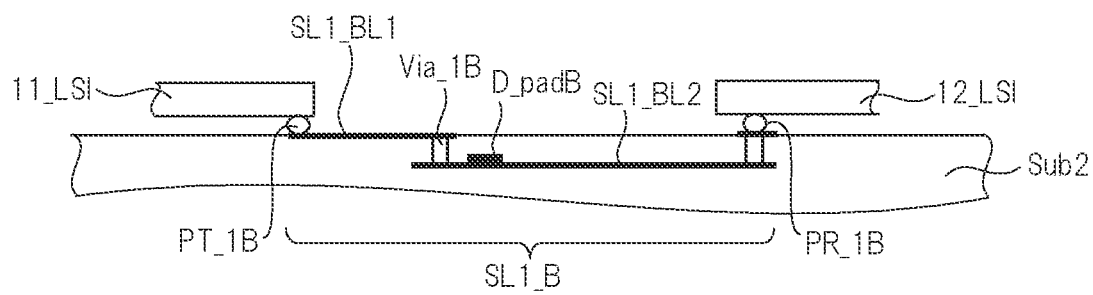
FIG. 12C is a diagram showing a configuration of the dummy-reflection source according to the fifth embodiment.
Figure 12D:
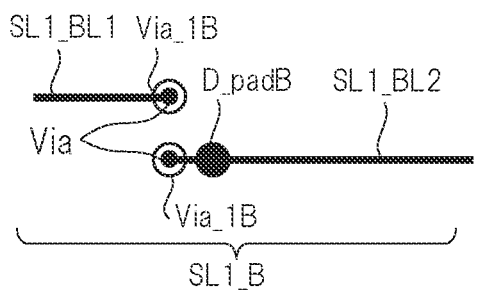
FIG. 12D is a diagram showing a configuration of the dummy-reflection source according to the fifth embodiment.

Diagram 12A and 12C is a cross-sectional view showing a cross section of the transmission line portion. Further, FIGS. 12B and 12D are plan views each showing a plane of the transmission line portion shown in FIGS. 12A and 12C. FIGS. 12A and 12C are similar to FIGS. 11B and 11C.

In FIG. 12B, in order to avoid complication of the drawing, the transmission line SL1_AL1 formed in the first layer and the transmission line SL1_AL2 formed in the second layer are drawn so as not to overlap, but the transmission line SL1_AL1 and the transmission line SL1_AL2 overlap in the area of the via pad indicated by the terminal Via_1A, and are connected via a common via. Similarly, in FIG. 12D, the transmission line SL1_BL1 and the transmission line SL1_BL2 overlap in the area of the via pad. indicated by the terminal Via_1B, and are connected via a shared via.

Each of the dummy reflection sources D_padA and D_padB is constituted by a circular pad arranged on the transmission lines SL1_AL2 and SL1_BL2 and connected to the corresponding transmission line. The diameters of the pads are larger than the widths of the transmission lines SL1_AL2 and SL1_BL2, as can be seen from FIGS. 12B and 12D.

FIG. 12 shows an example in which the pads forming the dummy reflection sources are arranged in the second layer, but when interference occurs between, for example, adjacent wirings (not shown) and the transmission lines SL1_AL2 and SL1_BL2 in the second layer, both of the two pads forming the dummy reflection sources D_padA and D_padB may be formed in the first layer and connected to the transmission lines SL1_AL1 and SL1_BL1 in the first layer.

The dummy reflection sources D_padA and D_padB may be arranged in different layers. In FIGS. 13A to 13D, a structure is shown in which a pad forming a dummy reflection source D_padA is disposed in a first layer and a pad forming a dummy reflection source D_padB is disposed in a second layer. Further, in 14A to 14D of the drawing, a pad for forming the dummy reflection source D_padA is disposed in the second layer, the pad for forming the dummy reflection source D_padB is disposed in the first layer structure is shown. In FIGS. 13A to 13D and FIGS. 14A to 14D, the diameter of the pad forming the dummy reflection source is larger than the width of the transmission line.

Figure 13A:
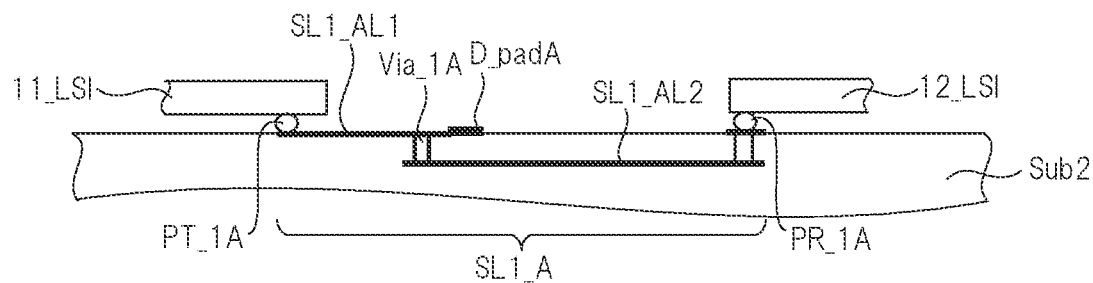
FIG. 13A is a diagram showing a configuration of the dummy-reflection source according to the fifth embodiment.
Figure 13B:
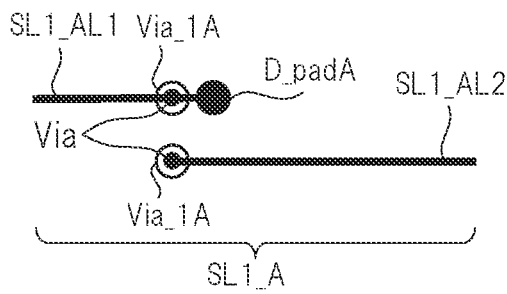
FIG. 13B is a diagram showing a configuration of the dummy-reflection source according to the fifth embodiment.
Figure 13C:
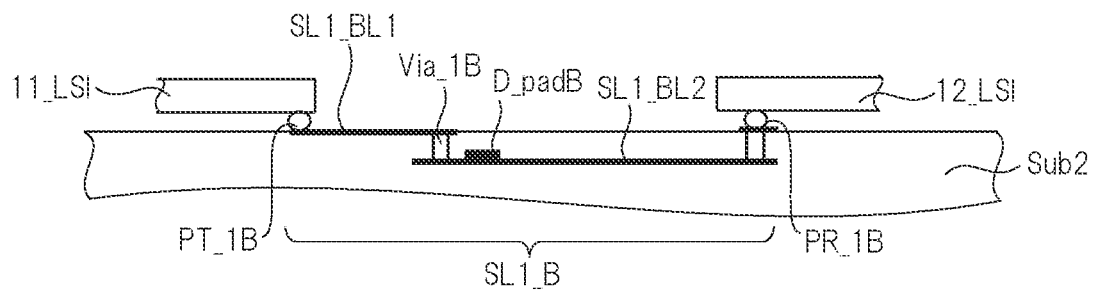
FIG. 13C is a diagram showing a configuration of the dummy-reflection source according to the fifth embodiment.
Figure 13D:
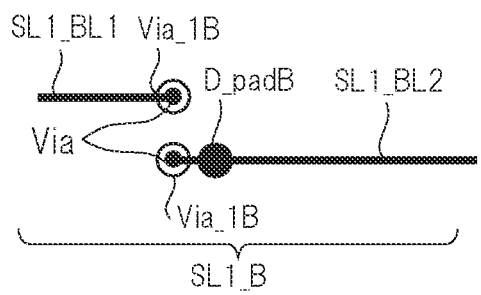
FIG. 13D is a diagram showing a configuration of the dummy-reflection source according to the fifth embodiment.
Figure 14A:
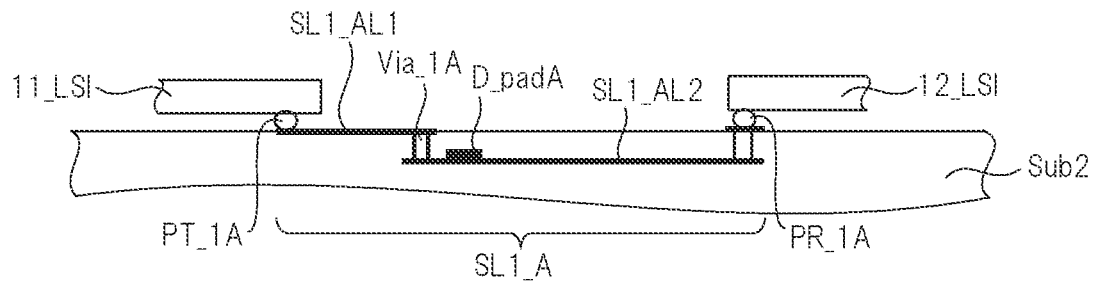
FIG. 14A is a diagram showing a configuration of the dummy-reflection source according to the fifth embodiment.
Figure 14B:
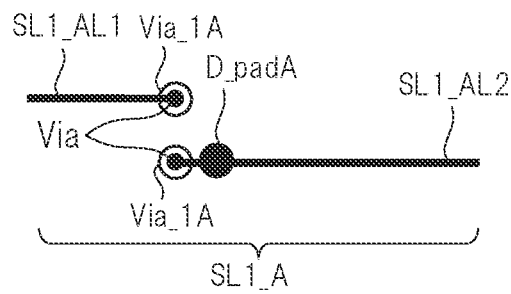
FIG. 14B is a diagram showing a configuration of the dummy-reflection source according to the fifth embodiment.
Figure 14C:
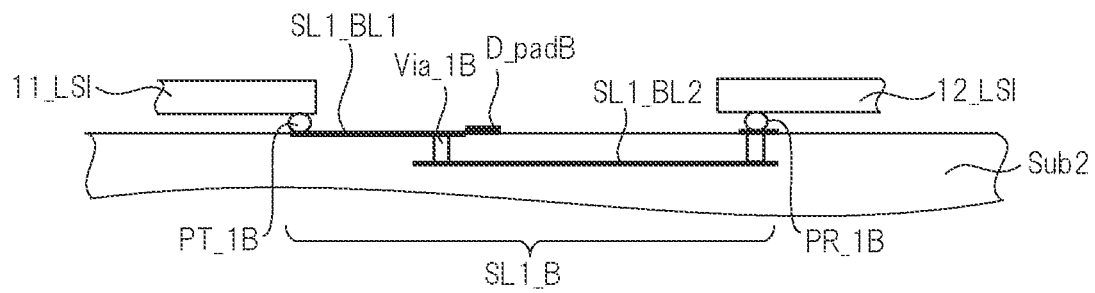
FIG. 14C is a diagram showing a configuration of the dummy-reflection source according to the fifth embodiment.
Figure 14D:
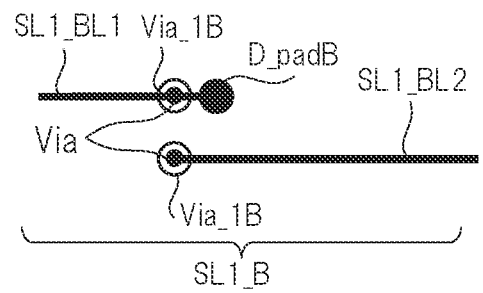
FIG. 14D is a diagram showing a configuration of the dummy-reflection source according to the fifth embodiment.
Figure 15A:
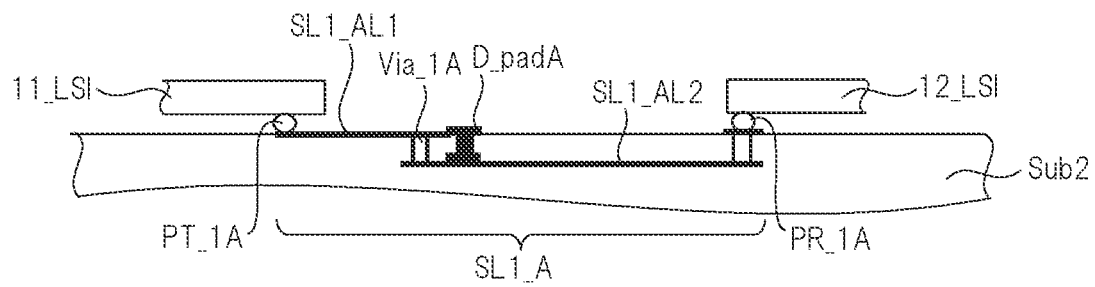
FIG. 15A is a diagram showing a structure of a dummy-reflection source according to the sixth embodiment.
Figure 15B:
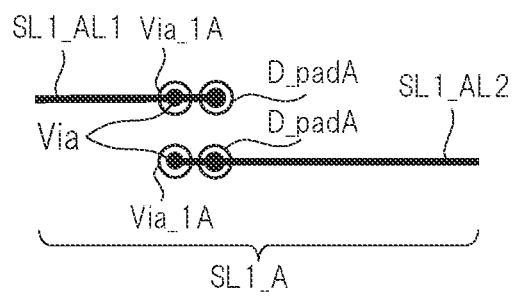
FIG. 15B is a diagram showing a structure of the dummy-reflection source according to the sixth embodiment.
Figure 15C:
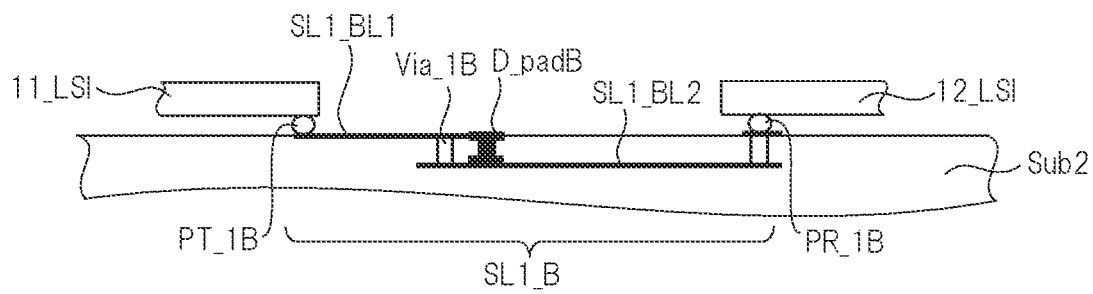
FIG. 15C is a diagram showing a structure of the dummy-reflection source according to the sixth embodiment.
Figure 15D:
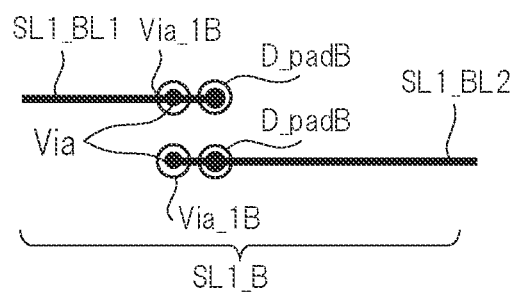
FIG. 15D is a diagram showing a structure of the dummy-reflection source according to the sixth embodiment.

As shown in FIGS. 13A and 13B, the transmission line SL1_AL1 extends beyond the terminal Via_1A, and is connected to the pads forming the dummy reflection source D_padA in the extending portion. Similarly, as shown in FIGS. 14C and 14D, the transmission line SL1_BL1 extends beyond the terminal Via_1B, and is connected to the pads forming the dummy reflection source D_padB at the extending portion.

Sixth Embodiment

The dummy reflection source is located at a grid point proximate to the original reflection source when the original reflection source is located at a position off (away from) the grid point, which is the intersection where the row and column grid lines intersect, as understood from FIG. 4. By placing the dummy reflection source at a position away from the original reflection source, a phase difference occurs between the phase of the reflected signal generated by the original reflection source and the phase of the reflected signal generated by the dummy reflection source, so that the two reflected signals having a phase difference are synthesized. Therefore, the dummy reflection source, similarly to the original reflection source, may be connected between the transmission lines formed in different layers from each other.

FIGS. 15A to 15D are diagrams showing structures of dummy-reflection sources according to the sixth embodiment. FIGS. 15A to 15D are similar to FIGS. 12A to 12D. The main difference is that the transmission lines SL1_AL1 and SL1_BL1 of the first layer and the transmission lines SL1_AL2 and SL1_BL2 of the second layer are electrically connected by dummy reflection sources D_padA and D_padB arranged at intersections of the virtual row grid lines and the virtual column grid lines. That is, the pads comprising the dummy reflection sources D_padA and D_padB are connected to the transmission lines SL1_AL1 and SL1_BL1 and the transmission lines SL1_AL2 and SL1_BL2 via a common via.

In this case, the terminal Via_1A and the dummy reflection source D_padA which are the original reflection source, when viewed electrically, becomes equivalent to one reflection source that generates a combined reflected signal. Similarly, the terminals Via_1B and the dummy reflection source D_padB, which are reflection sources, are also equivalent to one reflection source that generates a combined reflected signal.

<Modifications>

Figure 16:
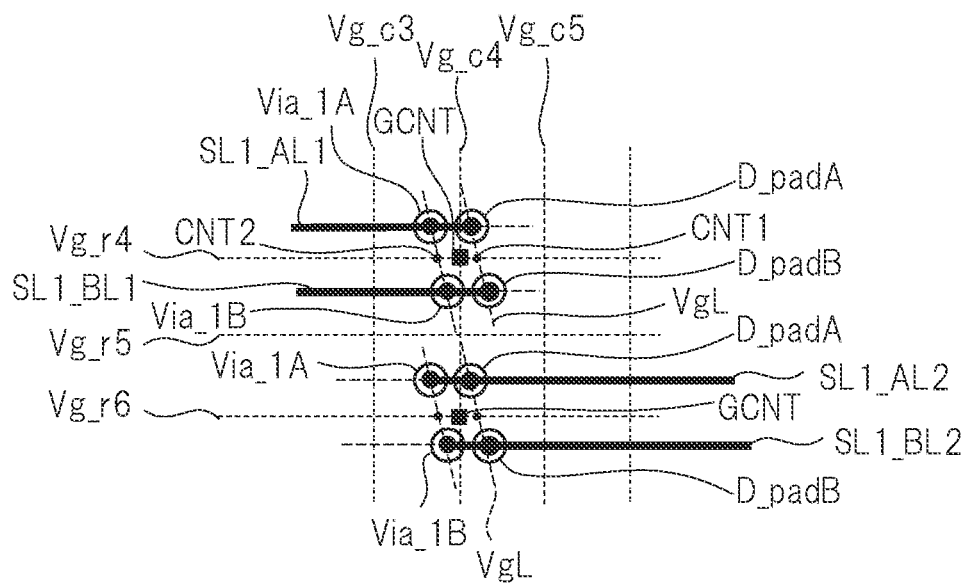
FIG. 16 is a diagram showing a modification of the dummy reflection source according to the sixth embodiment.

FIG. 16 is a diagram showing a modification of the dummy reflection source according to the sixth embodiment. In FIG. 16, transmission line pairs SL1_A and SL1_B for transmitting differential signals are shown as transmission lines. Transmission line SL1_A includes a transmission line SL1_AL1 of the first layer, and a transmission line SL1_AL2. All of the second layer, the transmission line SL1_B includes a transmission line SL1_BL1 of the first layer, and a transmission line SL1_BL2 of the second layer.

The transmission lane SL1_AL1 of the first layer is connected to the transmission line SL1_AL2 of the second layer by both the terminal Via_1A and the dummy reflection source D_padA, and the transmission line SL1_BL1 of the first layer is connected to the transmission line SL1_BL2 of the second layer by both the terminal Via_1B and the dummy reflection source D_padB.

As shown in FIG. 16, both the terminals Via_1A, Via_1B and the dummy reflection sources D_padA, D_padB are arranged outside the intersection where the virtual row grid line and the virtual column grid line intersect. In addition, the combined reflection source CNT1 existing on the virtual line VgL passing through the center of the dummy reflection sources D_padA and D_padB is also deviated from the intersection where the virtual row grid line and the virtual column grid line intersect, and the combined reflection source CNT2 formed by the terminals Via_1A and Via_1B is also deviated from the intersection where the virtual row grid line and the virtual column grid line intersect.

As described in FIGS. 15A-D, since the terminals Via_1A and the dummy reflection source D_padA, which are reflection sources, constitute one equivalent reflection source that generates a combined reflected signal, the center point between the combined reflection source CNT1 and CNT2 becomes the combined reflection source GCNT of the four reflection sources (terminals and dummy reflection sources). The combined reflection source GCNT, the virtual row grid lines Vg_r4, Vg_r6) and the virtual column grid lines (Vg_c4) are arranged at intersections intersecting (grid point). By arranging the combined reflectors GCNT at grid points, i.e. ½ data-wide distances UD/2, the effects of the equalizers can be suppressed from decreasing.

In FIG. 16 has been described the case of transmitting the differential signal, it may be a transmission line for transmitting a single-ended signal. In this case, the intersection where the virtual row grid lines and the virtual column grid lines intersect (grid point), so that the combined reflection source GCNT is disposed, for example, two reflection sources, may be arranged at a position of the transmission line away from the grid point.

According to a variation, the limitation of placing a reflection source at a grid point can be eliminated because a composite reflection source GCNT formed by a plurality of reflection sources (including a dummy reflection source) may be arranged at a grid point.

As described above, in the embodiment, by positively placing or forming a reflection source or a combined reflection source in the ½-data-width distance UD/2, the reflected signal in the data-width distance UD, becomes peaked. As a result, it is possible to suppress reduction of the effect of the equalizer for performing sampling in the data-width interval UI.

While the embodiment has been described as an example an equalizer using DFE as a filter circuit, it may be an equalizer using FFE, and, as described in Patent Document 1, it may be an equalizer using wiring. The equalizer may also be provided in the transmission unit.

In the embodiment, the reflection source is shown as a circular circle when viewed from above, but the shape of the reflection source is not limited to this. That is, when viewed in a plan view, the reflection source, with respect to the width of the transmission line extending, it is sufficient to have an outer shape having a wide width.

Although the invention made by the inventors of the present invention has been specifically described based on the embodiments, the present invention is not limited to the embodiments described above, and it is needless to say that various modifications can be made without departing from the gist thereof.

In this specification, a plurality of inventions are described in addition to the inventions described in the claims. Hereinafter, typical inventions among inventions not described in the claims be attached.

<Appendix>

A1. An electronic device including: a first semiconductor device for transmitting a signal, a second semiconductor device for receiving the signal, a substrate on which the first semiconductor device and the second semiconductor device are mounted, and a transmission line portion mounted on the substrate and connected between the first semiconductor device and he second semiconductor device, in which an equalizer that equalizes a waveform of the signal is provided with one of the transmitting unit and the receiving unit, in which a reflection source for reflecting the signal is arranged at a position in the transmission line portion, the position corresponding to a ½-data-width distance, the ½-data-width distance corresponds to a half of one-data-width distance obtained by converting one-data-width interval corresponding to a sampling period of the equalizer to a distance, and, in which, the position in the transmission line portion corresponds to a grid point where a row grid line and a column grid line drawn on a screen used in designing the transmission line portion and a column grid line drawn on the screen intersect with each other.

A1-1. The electronic device according to above-mentioned A1, in which the reflection source includes a first terminal having a larger width than the transmission line provided in the transmission line portion.

A1-2. The electronic device according to the above-mentioned A1-1, in which the transmission line includes: a first transmission line formed in the first layer in the substrate; and a second transmission line formed in a second layer that is different from the first layer, and the first transmission line and the second transmission line are electrically connected with each other through the first terminal.

A1-3. The electronic device according to the above-mentioned A1-1, in which the transmission line includes: a first transmission line formed in the first layer in the substrate; and a second transmission line formed in a second layer that is different from a layer in which the first layer is formed, and the first transmission line and the second transmission line are electrically connected through a second terminal, in which the first terminal is connected to one of the first transmission line and the second transmission line, and the second terminal is disposed within the ½-data-width distance.

A1-4. The electronic device according to above-mentioned A1, in which the signal is a differential signal, the transmission line portion includes a pair of transmission lines for transmitting the differential signal, and a reflection source is arranged on the pair of transmission lines at a grid point indicating the position of the ½-data-width distance between the pair of transmission lines such that a combined reflection source is arranged.

A1-5. The electronic device according to the above-mentioned A1-4, in which the reflection source includes a first terminal having a larger width than the transmission line provided in the transmission line portion.

A1-6. The electronic device according to the above-mentioned A1-5, in which each of the pair of transmission lines includes: a first transmission line; and a second transmission line formed in a layer different from a layer in which the first transmission line is formed in the substrate, and the first transmission line and the second transmission line are electrically connected through the first terminal.

A1-7. In the electronic device according to the above-mentioned A1-5, in which each of the pair of transmission lines includes: a first transmission line; and a second transmission line formed in a layer different from a layer in which the first transmission line is formed in the substrate, the first transmission line and the first transmission line are electrically connected through a second terminal, the first terminal is connected to one of the first transmission line and the second transmission line, and the second terminal is disposed within the ½-data-width distance.

What is claimed is:

1. A method of designing a transmission line portion coupled between a transmitting unit and a receiving unit and transmitting a signal from the transmitting unit to the receiving unit, comprising:
   (a) acquiring a one-data-width interval corresponding to a sampling period of an equalizer provided in one of the transmitting unit and the receiving unit;
   (b) after the (a), obtaining one-data-width distance corresponding to the one-data-width interval by converting the one-data-width interval to a distance, and obtaining a ½-data-width distance corresponding to a half of the one-data-width distance; and
   (c) after the (b), arranging a first reflection source for reflecting the signal at a position in the transmission line portion, the position corresponding to the ½-data-width distance obtained in the (b)
   wherein the position in the transmission line portion corresponds to a grid point where a row grid line drawn on a screen used in the designing method and a column grid line drawn on the screen intersect with each other.

2. The method of designing the transmission line portion according to claim 1, wherein the first reflection source is a dummy reflection source when a reflection source different from the first reflection source is present within the ½-data-width distance.

3. The method of designing the transmission line portion according to claim 1,
   wherein the signal is a differential signal,
   wherein the transmission line portion includes a pair of transmission lines for transmitting the differential signal, and
   wherein, in the (c), a second reflection source is arranged on the pair of transmission lines at the grid point indicating the position of the ½-data-width distance at the center between the pair of transmission lines such that a first combined reflection source for reflecting the differential signal is arranged as the first reflection source.

4. The method of designing the transmission line portion according to claim 3, wherein the second reflection source is a dummy reflection source when a second combined reflection source different from the first combined reflection source is present within the ½-data-width distance.

5. The method of designing the transmission line portion according to claim 1, wherein the transmission line portion includes a transmission line extending so as to overlap with one of the row grid line and the column grid line.

6. A semiconductor device comprising:
  a transmitting unit for transmitting a signal;
  a receiving unit for receiving the signal; and
  a transmission line portion connected between the transmitting unit and the receiving unit,
  wherein an equalizer that equalizes a waveform of the signal is provided with one of the transmitting unit and the receiving unit,
  wherein a reflection source for reflecting the signal is arranged at a position in the transmission line portion, the position corresponding to a ½-data-width distance,
  wherein the ½-data-width distance corresponds to a half of one-data-width distance obtained by converting one-data-width interval corresponding to a sampling period of the equalizer to a distance, and
  wherein the position in the transmission line portion corresponds to a grid point where a row grid line drawn on a screen used in designing the transmission line portion and a column grid line drawn on the screen intersect with each other.

7. The semiconductor device according to claim 6, wherein the reflection source includes a first terminal having a larger width than a transmission line provided in the transmission line portion.

8. The semiconductor device according to claim 7,
  wherein the transmission line includes:
    a first transmission line; and
    a second transmission disposed in a layer different from a layer in which the first transmission line is disposed, and
  wherein the first transmission line and the second transmission line are electrically connected with each other through the first terminal.

9. The semiconductor device according to claim 7,
  wherein the transmission line includes:
    a first transmission line; and
    a second transmission line disposed in a layer different from a layer n which the first transmission line is disposed, and electrically connected with the first transmission line through a second terminal,
  wherein the first terminal is connected to one of the first transmission line and the second transmission line, and
  wherein the second terminal is disposed within the ½-data-width distance.

10. The semiconductor device according to claim 6,
  wherein the signal is a differential signal,
  wherein the transmission line portion includes a pair of transmission lines for transmitting the differential signal, and
  wherein a reflection source is arranged on the pair of transmission lines at the grid point indicating the position of the ½-data-width distance between the pair of transmission lines such that a combined reflection source is arranged as the reflection source.

11. The semiconductor device according to claim 10, wherein the reflection source includes a first terminal having a larger width than the pair of transmission lines provided in the transmission line portion.

12. The semiconductor device according to claim 11,
  wherein each of the pair of transmission lines includes
    a first transmission line; and
    a second transmission line disposed in a layer different from a layer in which the first transmission line is disposed, and
  wherein the first transmission line and the second transmission line are electrically connected with each other through the first terminal.

13. The semiconductor device according to claim 11,
  wherein each of the pair of transmission lines includes
    a first transmission line; and
    a second transmission line disposed in a layer different from a layer in which the first transmission line is disposed, and electrically connected with the first transmission line through a second terminal,
  wherein the first terminal is connected to one of the first transmission line and the second transmission line, and
  herein the second terminal is disposed within the ½-data-width distance.

* * * * *